(12) United States Patent
Zhao et al.

(10) Patent No.: US 11,985,408 B2
(45) Date of Patent: May 14, 2024

(54) PHOTOSENSITIVE ASSEMBLY, CAMERA MODULE, METHOD FOR MANUFACTURING CAMERA MODULE, AND ELECTRONIC DEVICE

(71) Applicant: NINGBO SUNNY OPOTECH CO., LTD., Zhejiang (CN)

(72) Inventors: Bojie Zhao, Zhejiang (CN); Zhewen Mei, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 356 days.

(21) Appl. No.: 17/299,029

(22) PCT Filed: Oct. 25, 2019

(86) PCT No.: PCT/CN2019/113348
§ 371 (c)(1),
(2) Date: Jun. 2, 2021

(87) PCT Pub. No.: WO2020/114143
PCT Pub. Date: Jun. 11, 2020

(65) Prior Publication Data
US 2022/0038609 A1 Feb. 3, 2022

(30) Foreign Application Priority Data

Dec. 4, 2018 (CN) .......................... 201811473751.X
Dec. 4, 2018 (CN) .......................... 201811493456.0
Dec. 4, 2018 (CN) .......................... 201822026719.9

(51) Int. Cl.
*H04N 23/57* (2023.01)
*H04N 23/55* (2023.01)

(52) U.S. Cl.
CPC ............. *H04N 23/57* (2023.01); *H04N 23/55* (2023.01)

(58) Field of Classification Search
CPC ........ H04N 23/57; H04N 23/55; H04N 23/54; H04N 23/52; H01L 27/14618; G03B 30/00; G03B 17/02
See application file for complete search history.

(56) References Cited

U.S. PATENT DOCUMENTS

2017/0155807 A1   6/2017 Zhang et al.

FOREIGN PATENT DOCUMENTS

| CN | 105511206 | * 4/2016 | ............. G03B 17/12 |
| CN | 107277336 |   10/2017 | |

(Continued)

OTHER PUBLICATIONS

Extended European Search Report dated Feb. 10, 2022 in corresponding European Patent Application No. 198922650.

(Continued)

*Primary Examiner* — Yosef K Laekemariam
(74) *Attorney, Agent, or Firm* — Wenderoth, Lind & Ponack, L.L.P.

(57) ABSTRACT

A camera module includes optical lenses, a light filter, a circuit board, a photosensitive chip conductively connected to the circuit board, and a bonding portion. The bonding portion has a lower bonding side, a top bonding surface, and a light path. The lower bonding side of the bonding portion is bonded to a circuit board assembly, and the bonding portion surrounds a photosensitive area of the photosensitive chip, so that the photosensitive area of the photosensitive chip is exposed to the light path of the bonding portion. A periphery of the light filter is bonded to the top bonding surface of the bonding portion, so that the light filter is kept in the light path of the photosensitive chip by the bonding portion. The optical lenses are kept in the photosensitive path of the photosensitive chip, effectively reducing the height of the camera module.

18 Claims, 16 Drawing Sheets

(56) References Cited

FOREIGN PATENT DOCUMENTS

| CN | 206743373 | | 12/2017 | | |
|---|---|---|---|---|---|
| CN | 207820032 | | 9/2018 | | |
| CN | 208077979 | | 11/2018 | | |
| EP | 3 481 046 | * | 4/2017 | ............ | H04N 5/225 |
| EP | 3 481 046 | | 5/2019 | | |
| WO | 2017/186120 | | 11/2017 | | |

OTHER PUBLICATIONS

International Search Report dated Feb. 1, 2020 in International (PCT) Application No. PCT/CN2019/113348 with English translation.

* cited by examiner

PHOTOSENSITIVE ASSEMBLY, CAMERA MODULE, METHOD FOR MANUFACTURING CAMERA MODULE, AND ELECTRONIC DEVICE

TECHNICAL FIELD

The invention relates to field of optical imaging, in particular to a photosensitive assembly, a camera module, a method for manufacturing the camera module, and an electronic device.

BACKGROUND ART

In recent years, smart devices, such as smart phones, have become increasingly lighter, thinner, and more high-performance. This development trend of smart devices has raised more demanding requirements for the size and imaging capabilities of the camera module, which is one of the standard configurations of smart devices.

In terms of hardware, the imaging capability of the camera module depends on the number and size of the electronic components in the circuit and the parameters of the photosensitive chip, for example, the size of the photosensitive surface of the photosensitive chip. In other words, the number and size of electronic components and the parameters of the photosensitive chip are the basis for improving the imaging capability of the camera module. However, the existing technology for packaging camera modules has greatly increased the size of camera modules with a greater number and higher size of electronic components and photosensitive chips with better parameters, as a result, the development trend of the size of the high-performance camera modules is contrary to the development trend of the smart devices.

FIG. 1 shows a typical camera module in the prior art, which includes a circuit board 1P, a set of electronic components 2P, a photosensitive chip 3P, a lenses holder 4P, a light filter 5P, a lenses bearing portion 6P, and a lenses 7P. Firstly, a set of the electronic components 2P are mounted on the circuit board 1P at intervals; secondly, the photosensitive chip 3P is mounted on the circuit board 1P, and the photosensitive chip 3P is conductively connected to the circuit board 1P through at least one set of gold wires 8P, wherein a set of the electronic components 2P surrounds the photosensitive chip 3P; thirdly, the lenses holder 4P is mounted on the circuit board 1P by surrounding the photosensitive chip 3P, and a light filter bearing arm 41P of the lenses holder 4P protrudes from an inner wall of the lenses holder 4P, so as to extend toward the direction of the photosensitive path of the photosensitive chip 3P; fourthly, the light filter 5P is mounted on the light filter bearing arm 41P of the lenses holder 4P, so as to maintain the light filter 5P in the photosensitive path of the photosensitive chip 3P; fifthly, the lenses 7P is arranged on the lenses bearing portion 6P, and the lenses bearing portion 6P is mounted on the lenses holder 4P, so as to maintain the lenses 7P in the photosensitive path of the photosensitive chip 3P. In the camera module of the prior art, the light filter 5P needs to be carried by the light filter bearing arm 41P of the lenses holder 4P. Therefore, the lenses holder 4P must be designed to have a structure of the light filter bearing arm 41P, and this causes the lenses holder 4P to occupy more height space, so that it is difficult to reduce the size in height of the camera module. In addition, in order to prevent the light filter bearing arm 41P of the lenses holder 4P from contacting with the electronic component 2P, a space needs to be reserved between the light filter bearing arm 41P and the electronic component 2P, this also makes it difficult to reduce the size in height of the camera module.

CONTENTS OF THE INVENTION

An object of the present invention is to provide a photosensitive assembly, a camera module, a method for manufacturing the camera module, and an electronic device, wherein the size in height of the camera module may be reduced, so that the camera module is particularly suitable for being applied to electronic device pursuing thinner and lighter.

An object of the present invention is to provide a photosensitive assembly, a camera module, a method for manufacturing the camera module, and an electronic device, wherein a light filter of the camera module does not need to be kept in a photosensitive path of a photosensitive chip by being supported by a lenses holder, so as to save height space occupied by the lenses holder, thereby reducing the size in height of the camera module An object of the present invention is to provide a photosensitive assembly, a camera module, a method for manufacturing the camera module, and an electronic device, wherein a back focus size of the camera module may be reduced to effectively reduce the size in height of the camera module, and particularly, in a preferred example of the camera module according to the present invention, the back focus size of the camera module may be reduced to 0.6 mm or less, thereby effectively reducing the size in height of the camera module.

An object of the present invention is to provide a photosensitive assembly, a camera module, a method for manufacturing the camera module, and an electronic device, wherein a distance between a mounting surface of a lenses bearing portion of the camera module and a lower surface of the light filter may be reduced, so as to effectively reduce the size in height of the camera module, and particularly, in another preferred example of the camera module according to the present invention, the distance between the mounting surface of the lenses bearing portion and the lower surface of the light filter may be reduced to 0.2 mm or less, thereby effectively reducing the size in height of the camera module.

An object of the present invention is to provide a photosensitive assembly, a camera module, a method for manufacturing the camera module, and an electronic device, wherein the camera module provides a bonding portion, and the bonding portion is used to combine the light filter and a circuit board assembly of the camera module, so that the light filter is kept in the photosensitive path of the photosensitive chip by the bonding portion, and in this way, the light filter does not need to be supported by the lenses holder.

An object of the present invention is to provide a photosensitive assembly, a camera module, a method for manufacturing the camera module, and an electronic device, wherein a plane on which a top bonding surface of the bonding portion is located is higher than a plane on which a photosensitive area of the photosensitive chip is located, and a height difference between the two is controlled within a suitable range, and in this way, generation of stray light and imaging of dirty spots may be reduced, thereby improving the imaging quality of the camera module.

An object of the present invention is to provide a photosensitive assembly, a camera module, a method for manufacturing the camera module, and an electronic device, wherein a width of the bonding portion is controlled within a suitable range, and in this way, packaging tolerances may be compensated, thereby ensuring the reliability of the camera module.

An object of the present invention is to provide a photosensitive assembly, a camera module, a method for manufacturing the camera module, and an electronic device, wherein the top bonding surface of the bonding portion corresponds to a non-photosensitive area of the photosensitive chip, and in this way, flatness of the top bonding surface of the bonding portion may be ensured, thereby ensuring flatness between the light filter and the photosensitive area of the photosensitive chip.

An object of the present invention is to provide a photosensitive assembly, a camera module, a method for manufacturing the camera module, and an electronic device, wherein the top bonding surface of the bonding portion corresponds to electronic components arranged at a same height, and in this way, the flatness of the top bonding surface of the bonding portion may be ensured, thereby ensuring the flatness between the light filter and the photosensitive area of the photosensitive chip.

An object of the present invention is to provide a photosensitive assembly, a camera module, a method for manufacturing the camera module, and an electronic device, wherein the lower surface of the lenses holder is bonded to the circuit board, and the inner surface of the lenses holder is bonded to the bonding portion, and in this way, the reliability of the camera module may be improved.

An object of the present invention is to provide a photosensitive assembly, a camera module, a method for manufacturing the camera module, and an electronic device, wherein the lenses holder has at least one notch, so that glue material for forming the bonding portion may be discharged from the notch of the lenses holder during the process of mounting the lenses holder on the circuit board assembly and heating the lenses holder, thereby avoiding excessive glue material overflow inward to contaminate the photosensitive area of the photosensitive chip.

An object of the present invention is to provide a photosensitive assembly, a camera module, a method for manufacturing the camera module, and an electronic device, wherein air between the glue material and the inner surfaces of the lenses holder may be discharged from the notch during the process of mounting the lenses holder on the circuit board assembly and heating the lenses holder, thereby guiding the glue material to expand toward the direction of the inner surface of the lenses holder, so as to avoid excessive glue material overflow inward to contaminate the photosensitive area of the photosensitive chip.

An object of the present invention is to provide a photosensitive assembly, a camera module, a method for manufacturing the camera module, and an electronic device, wherein the camera module is applied to an electronic device, thereby facilitating to increase a screen-to-body ratio of the electronic device.

An object of the present invention is to provide a photosensitive assembly, a camera module, a method for manufacturing the camera module, and an electronic device, wherein at least one side portion of the camera module forms a retracting portion, and in this way, the camera module may be closer to an edge of an electronic device body, thereby facilitating to increase the screen-to-body ratio of the electronic device.

According to one aspect of the present invention, the present invention provides a camera module including:
an optical lenses;
a light filter;
a circuit board assembly, wherein the circuit board assembly includes a circuit board and a photosensitive chip conductively connected to the circuit board; and
a bonding portion, wherein the bonding portion has a lower bonding side, a top bonding surface, and a light path, and the lower bonding side of the bonding portion is bonded to the circuit board assembly, and the bonding portion surrounds a photosensitive area of the photosensitive chip, so that the photosensitive area of the photosensitive chip is exposed to the light path of the bonding portion, and periphery of the light filter is bonded to the top bonding surface of the bonding portion, so that the light filter is kept in the photosensitive path of the photosensitive chip by the bonding portion, and the optical lenses is kept in the photosensitive path of the photosensitive chip.

According to an embodiment of the present invention, the lower bonding side of the bonding portion is bonded to a non-photosensitive area of the photosensitive chip, and the top bonding surface of the bonding portion corresponds to the non-photosensitive area of the photosensitive chip.

According to an embodiment of the present invention, the lower bonding side of the bonding portion is bonded to the circuit board and the non-photosensitive area of the photosensitive chip, and the top bonding surface of the bonding portion corresponding to the non-photosensitive area of the photosensitive chip.

According to an embodiment of the present invention, the circuit board assembly further includes a set of electronic components, wherein at least three of the electronic components are arranged at equal heights on and are conductively connected to the circuit board, and the bonding portion embeds the electronic components, and the top bonding surface of the bonding portion corresponds to the electronic components.

According to an embodiment of the present invention, a plane on which the top bonding surface of the bonding portion is located is lower than a plane on which a top surface of the tallest electronic component is located.

According to an embodiment of the present invention, a distance between the plane on which the top bonding surface of the bonding portion is located and the plane on which photosensitive area of the photosensitive chip is located is greater than or equal to 0.15 mm.

According to an embodiment of the present invention, the bonding portion has four sides, and the adjacent sides are connected end to end and perpendicular to each other to form the light path between the four sides, and a width of at least one side of the bonding portion is greater than or equal to 0.15 mm.

According to an embodiment of the present invention, the camera module further includes a lenses holder, wherein the lenses holder has a lower surface, and the lower surface of the lenses holder is mounted on the circuit board.

According to an embodiment of the present invention, the camera module further includes a lenses holder, wherein the lenses holder has a lower surface, an upper surface corresponding to the lower surface, and an inner surface extending from the upper surface to the lower surface, wherein the lower surface of the lenses holder is mounted on the circuit board, and the inner surface of the lenses holder is bonded to the bonding portion.

According to an embodiment of the present invention, the camera module further includes a lenses holder, wherein the lenses holder has a lower surface, an upper surface corresponding to the lower surface, and an inner surface extending from the upper surface to the lower surface, wherein the lower surface of the lenses holder is bonded to the circuit board, and the inner surface of the lenses holder is bonded to the bonding portion.

According to an embodiment of the present invention, the camera module further includes a lenses holder, wherein the lenses holder has a lower surface, an upper surface corresponding to the lower surface, and an inner surface extending from the upper surface to the lower surface, wherein the lower surface of the lenses holder is bonded to the circuit board and the non-photosensitive area of the photosensitive chip, and the inner surface of the lenses holder is bonded to the bonding portion.

According to an embodiment of the present invention, the camera module has four side portions, wherein at least one of the side portions has a side surface, a bottom surface, and a connecting surface connected to the side surface and the bottom surface, and wherein a distance from a connection position of the connecting surface and the side surface to a central axis of the camera module is greater than a distance from a connection position of the connecting surface and the bottom surface to the central axis of the camera module.

According to an embodiment of the present invention, the connecting surface is an inclined plane; or the connecting surface is a convex arc surface; or the connecting surface is a step surface.

According to an embodiment of the present invention, the connecting surface is formed on the lenses holder and the circuit board.

According to an embodiment of the present invention, the lenses holder has at least one notch extending from the lower surface of the lenses holder to a direction of the upper surface, wherein a part of the bonding portion is accommodated in the notch of the lenses holder.

According to an embodiment of the present invention, the camera module further includes a lenses bearing portion having a mounting surface, wherein the lenses bearing portion is mounted on the lenses holder by attaching the mounting surface of the lenses bearing portion to the upper surface of the lenses holder, and the optical lenses is arranged on the lenses bearing portion.

According to an embodiment of the present invention, a range of value of a distance parameter D between the mounting surface of the lenses bearing portion and the lower surface of the light filter is: 0.1 mm≤D≤0.2 mm.

According to an embodiment of the present invention, a range of value of a back focal length parameter L of the camera module is: 0.4 mm≤L≤0.6 mm, wherein the back focal length of the camera module refers to a distance between a lower surface of a lens of the optical lenses close to the photosensitive chip and the photosensitive area of the photosensitive chip.

According to another aspect of the present invention, the present invention further provides an electronic device, which includes an electronic device body and at least one camera module arranged in the electronic device body, wherein the camera module includes:
   an optical lenses;
   a light filter;
   a circuit board assembly, wherein the circuit board assembly includes a circuit board and a photosensitive chip conductively connected to the circuit board; and
   a bonding portion, wherein the bonding portion has a lower bonding side, a top bonding surface, and a light path, wherein the lower bonding side of the bonding portion is bonded to the circuit board assembly, and the bonding portion surrounds a photosensitive area of the photosensitive chip, so that the photosensitive area of the photosensitive chip is exposed to the light path of the bonding portion, and periphery of the light filter is bonded to the top bonding surface of the bonding portion, so that the light filter is kept in the photosensitive path of the photosensitive chip by the bonding portion, and the optical lenses is kept in the photosensitive path of the photosensitive chip.

According to another aspect of the present invention, the present invention further provides a photosensitive assembly including:
   a light filter;
   a circuit board assembly, wherein the circuit board assembly includes a circuit board and a photosensitive chip conductively connected to the circuit board; and
   a bonding portion, wherein the bonding portion has a lower bonding side, a top bonding surface, and a light path, wherein the lower bonding side of the bonding portion is bonded to the circuit board assembly, and the bonding portion surrounds a photosensitive area of the photosensitive chip, so that the photosensitive area of the photosensitive chip is exposed to the light path of the bonding portion, and periphery of the light filter is bonded to the top bonding surface of the bonding portion, so that the light filter is kept in the photosensitive path of the photosensitive chip by the bonding portion.

According to an embodiment of the present invention, the lower bonding side of the bonding portion is bonded to the non-photosensitive area of the photosensitive chip, and the top bonding surface of the bonding portion corresponds to the non-photosensitive area of the photosensitive chip.

According to an embodiment of the present invention, the lower bonding side of the bonding portion is bonded to the circuit board and the non-photosensitive area of the photosensitive chip, and the top bonding surface of the bonding portion corresponds to the non-photosensitive area of the photosensitive chip.

According to an embodiment of the present invention, the circuit board assembly further includes a set of electronic components, wherein at least three of the electronic components are arranged at equal heights on and are conductively connected to the circuit board, and the bonding portion embeds the electronic components, and the top bonding surface of the bonding portion corresponds to the electronic components.

According to an embodiment of the present invention, a plane on which the top bonding surface of the bonding portion is located is lower than a plane on which a top surface of the tallest electronic component is located.

According to an embodiment of the present invention, a distance between the plane on which the top bonding surface of the bonding portion is located and the plane on which the photosensitive area of the photosensitive chip is located is greater than or equal to 0.15 mm.

According to an embodiment of the present invention, the bonding portion has four sides, and the adjacent sides are connected end to end and perpendicular to each other to form the light path between the four sides, and a width of at least one side of the bonding portion is greater than or equal to 0.15 mm.

According to one aspect of the present invention, the present invention provides a method for manufacturing a camera module, wherein the manufacturing method includes the following steps:
   (a) respectively bonding a lower bonding side of a bonding portion to a circuit board assembly and bonding a light filter to a top bonding surface of the bonding portion, so as to keep the light filter in a photosensitive path of a photosensitive chip of the circuit board assembly; and (b) keeping an optical lenses in the photosensitive path of the photosensitive chip to manufacture the camera module.

According to an embodiment of the present invention, the step (a) further includes the following steps:

(a.1) applying glue material to the circuit board assembly around a photosensitive area of the photosensitive chip;

(a.2) mounting the light filter on the top of the glue material; and (a.3) curing the glue material to form the bonding portion, wherein a side portion of the glue material bonded to the circuit board assembly forms the lower bonding side of the bonding portion, and a side portion of the glue material bonded to the light filter forms the top bonding surface of the bonding portion.

According to an embodiment of the present invention, in the step (a.2), pressure is applied to the light filter in a direction towards the photosensitive chip, so as to mount the light filter on the top of the glue material.

According to an embodiment of the present invention, before the step (a.3), the step (a) further includes the step of: mounting a lenses holder on a circuit board of the circuit board assembly, so that in the step (a.3), the lower surface of the lenses holder is bonded to the circuit board, and the inner surface of the lenses holder is bonded to the bonding portion.

According to an embodiment of the present invention, in the step (a.3), the glue material is configured to overflow from a notch of the lenses holder.

According to an embodiment of the present invention, in the step (a.3), the glue material is guided to expand toward a direction of the inner surface of the lenses holder.

According to an embodiment of the present invention, in the above method, air held between the glue material and the inner surface of the lenses holder is allowed to escape from a notch of the lenses holder, thereby guiding the glue material to expand toward the direction of the inner surface of the lenses holder.

According to an embodiment of the present invention, in the step (a.1), a glue material is applied to a non-photosensitive area of the photosensitive chip, so that in the step (a.3), the top bonding surface of the bonding portion corresponds to the non-photosensitive area of the photosensitive chip.

According to an embodiment of the present invention, in the step (a.1), a glue material is configured to cover at least three electronic components which are arranged at the same height and conductively connected to a circuit board of the circuit board assembly; so that in the step (a.3), the top bonding surface of the bonding portion corresponds to the electronic components.

According to an embodiment of the present invention, in the step (a.1), a glue material is configured to cover at least three electronic components which are arranged at the same height and conductively connected to a circuit board; so that in the step (a.3), the top bonding surface of the bonding portion corresponds to the electronic components.

According to an embodiment of the present invention, in the step (a.1), a glue material is applied to the circuit board assembly along an extension direction of a set of electronic components of the circuit board, and before the step (a.2) and the step (a.3), a gap formed between the light filter and the circuit board assembly is sealed.

According to an embodiment of the present invention, the step (a) further includes the following steps:

(a.1') forming a ring-shaped boss on peripheral edges of the light filter;

(a.2') mounting the ring-shaped boss on the non-photosensitive area of the photosensitive chip; and (a.3') curing the ring-shaped boss to form the bonding portion, wherein a side portion of the ring-shaped boss bonded to the non-photosensitive area of the photosensitive chip forms the lower bonding side of the bonding portion, and a side portion of the ring-shaped boss bonded to the light filter forms the top bonding surface of the bonding portion.

According to an embodiment of the present invention, a distance between a plane on which the top bonding surface of the bonding portion is located and a plane on which the photosensitive area of the photosensitive chip is located is greater than or equal to 0.15 mm.

According to an embodiment of the present invention, the bonding portion has four sides, and the adjacent sides are connected end to end and perpendicular to each other to form the light path between the four sides, wherein a width of at least one of the side edges of the bonding portion is greater than or equal to 0.15 mm.

According to an embodiment of the present invention, in the step (a.2'), the ring-shaped boss is mounted on the non-photosensitive area of the photosensitive chip by glue.

According to an embodiment of the present invention, the step (a) further includes the following steps:

(a.1") forming a ring-shaped boss on the non-photosensitive area of the photosensitive chip;

(a.2") mounting peripheral edges of the light filter on the ring-shaped boss; and (a.3") curing the ring-shaped boss to form the bonding portion, wherein a side portion of the ring-shaped boss bonded to the non-photosensitive area of the photosensitive chip forms the lower bonding side of the bonding portion, and a side portion of the ring-shaped boss bonded to the light filter forms the top bonding surface of the bonding portion.

According to an embodiment of the present invention, in the step (a.2"), the light filter is mounted on the ring-shaped boss by glue.

According to an embodiment of the present invention, after the step (a), the manufacturing method further includes the step of: mounting a lenses holder on a circuit board of the circuit board assembly, so that in the step (c), the optical lenses is kept in the photosensitive path of the photosensitive chip by the lenses holder.

According to an embodiment of the present invention, after the step (a), the manufacturing method further includes the step of: forming a lenses holder on a circuit board of the circuit board assembly, so that in the step (c), the optical lenses is kept in the photosensitive path of the photosensitive chip by the lenses holder.

According to an embodiment of the present invention, after the step (c), the manufacturing method further includes the step of: removing a part of at least one side portion of the camera module, so that the side portion forms a side surface, a bottom surface, and a connecting surface connected to the side surface and the bottom surface, wherein a distance from a connection position of the connecting surface and the side surface to a central axis of the camera module is greater than a distance from a connection position of the connecting surface and the bottom surface to the central axis of the camera module.

According to an embodiment of the present invention, in the above method, the side portion of the camera module is cut, so that the side portion forms the side surface, the bottom surface, and the connecting surface connected to the side surface and the bottom surface.

According to an embodiment of the present invention, in the above method, the side portion of the camera module is ground, so that the side portion forms the side surface, the bottom surface, and the connecting surface connected to the side surface and the bottom surface.

SPECIFIC EMBODIMENTS

Figure 1:
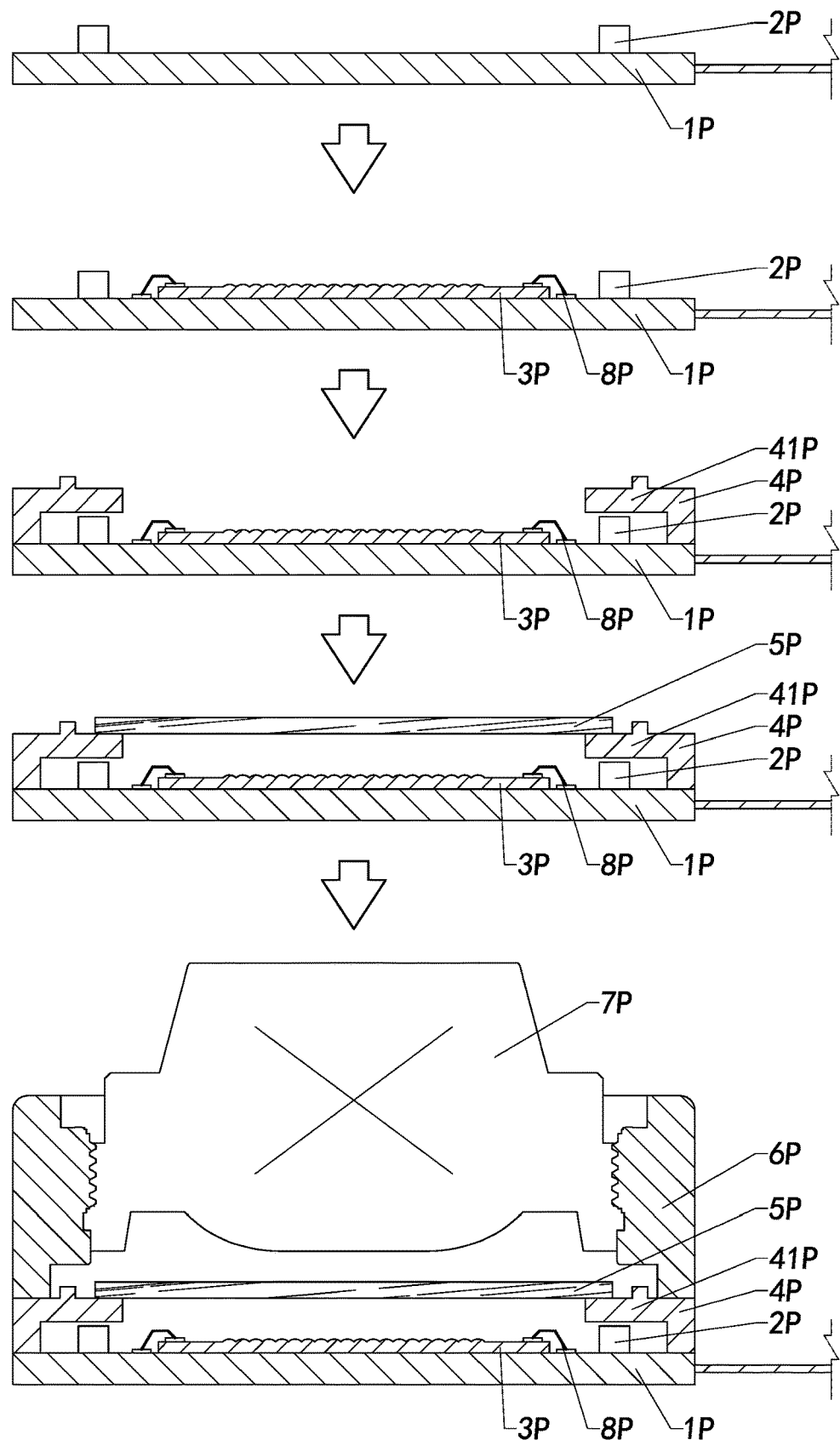
FIG. 1 is a schematic diagram of a camera module in the prior art.

The following description is used to disclose the present invention so that those skilled in the art may implement the present invention. The preferred embodiments in the following description are only examples, and those skilled in the art may think of other obvious variations. The basic principles of the present invention defined in the following description may be applied to other embodiments, modifications, improvements, equivalents, and other technical solutions that do not deviate from the spirit and scope of the present invention.

Those skilled in the art should understand that in the disclosure of the present invention, the orientation or positional relationship indicated by the terms "longitudinal", "lateral", "upper", "lower", "front", "rear", "left", "right", "vertical", "horizontal", "top", "bottom", "inner", "outer", etc. are based on an orientation or positional relationship shown in the drawings, which is only for the convenience of describing the present invention and simplifying the description, rather than indicating or implying that the device or element referred to must have a specific orientation, be constructed and operated in a specific orientation, and therefore the above-mentioned terms should not be construed as limiting the present invention.

It may be understood that the term "a/an" should be understood as "at least one" or "one or more", i.e., in one embodiment, the number of an element may be one, and in another embodiment, the number of the element may be more than one, and the term "one" cannot be understood as a restriction on the number.

Referring to FIGS. 2-8 of the accompanying drawings of the specification of the present invention, a camera module 1000 according to the first preferred embodiment of the present invention is disclosed and explained in the following description, wherein the camera module 1000 includes a circuit board assembly 10, a bonding portion 20, a light filter 30, and an optical lenses 40.

Figure 7:
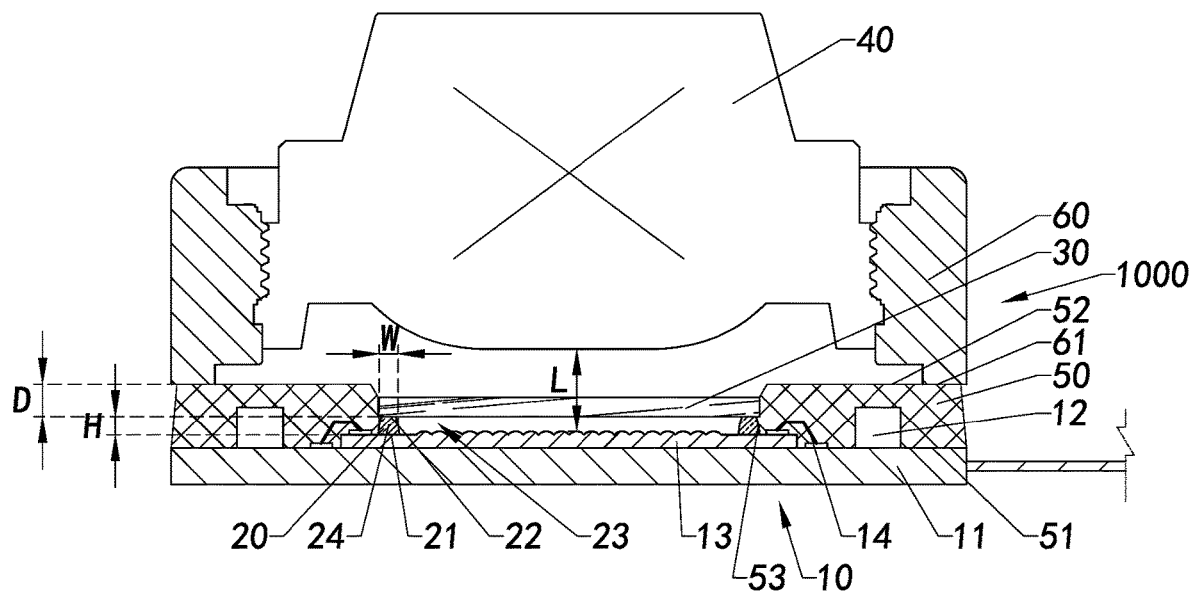
FIG. 7 is a schematic sectional view of the sixth manufacturing process of the camera module according to the above preferred embodiment of the present invention, which shows a sectional state of the camera module after being cut along a middle position.
Figure 8:
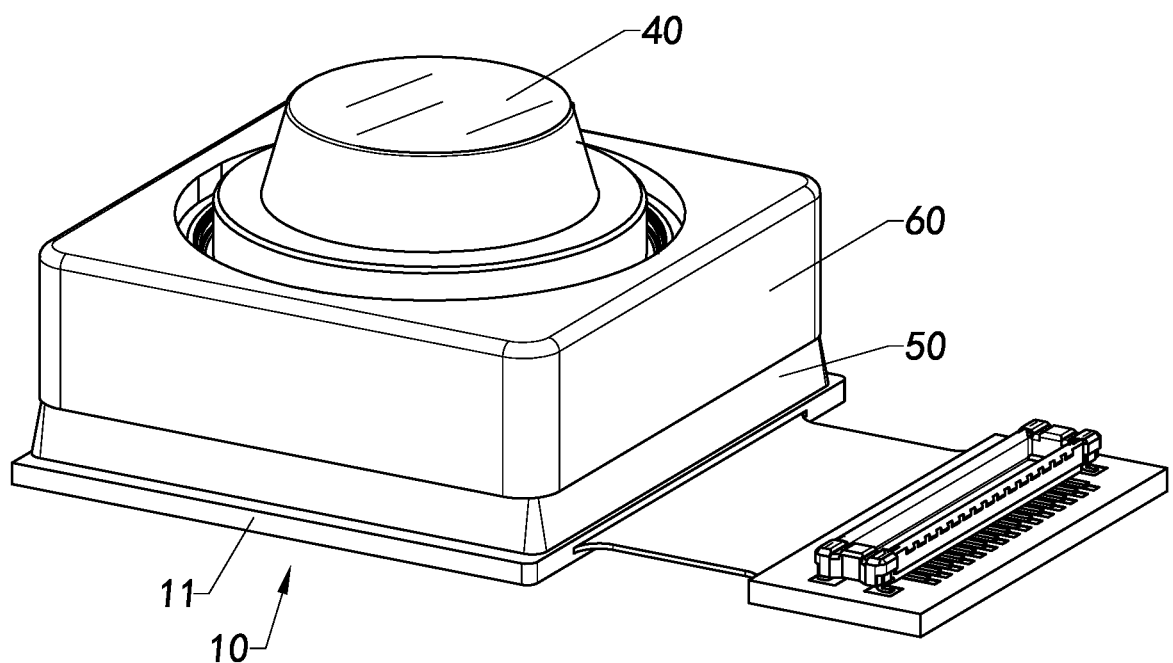
FIG. 8 is a three-dimensional schematic diagram of the camera module according to the above preferred embodiment of the present invention.

Referring to FIGS. 7-8, the circuit board assembly 10 includes a circuit board 11 and a set of electronic components 12 conductively connected to the circuit board 11, and there is a gap between the adjacent electronic components 12. The manner of conductively connecting the electronic component 12 to the circuit board 11 is not limited. For example, in the specific example of the camera module 1000 shown in FIGS. 7-8, the electronic component 12 is conductively connected to the circuit board 11 by being mounted on the surface of the circuit board 11. Optionally, the electronic component 12 is conductively connected to the circuit board 11 in such a manner that at least a part of it is embedded inside of the circuit board 11.

Further referring to FIGS. 7-8, the circuit board assembly 10 further includes a photosensitive chip 13, which has a photosensitive area 131 and a non-sensitive area 132 surrounding the photosensitive area 131, wherein the photosensitive chip 13 is conductively connected to the circuit board 11. The manner of conductively connecting the photosensitive chip 13 to the circuit board 11 is not limited. For example, in the specific example of the camera module 1000 shown in FIGS. 7-8, the photosensitive chip 13 is mounted on the surface of the circuit board 11, and two ends of at least one set of guiding wires 14 formed by a wire bonding process are conductively connected to the photosensitive chip 13 and the circuit board 11, respectively, so that the photosensitive chip 13 is conductively connected to the circuit board 11. Optionally, the photosensitive chip 13 is mounted on the circuit board 11 and conductively connected to the circuit board 11 by a flip-chip process.

Particularly, in the camera module 1000 shown in FIGS. 7-8, a set of the electronic components 12 form two rows of the electronic components 12, wherein one row of the electronic components 12 are located on the left side of the photosensitive chip 13, another row of the electronic components 12 are located on the right side of the photosensitive chip 13. Optionally, a set of the electronic components 12 form three rows of the electronic components 12, wherein the three rows of the electronic components 12 are respectively located on three sides of the photosensitive chip 13. Optionally, a set of the electronic components 12 form four rows of the electronic components 12, wherein the four rows of the electronic components 12 are located on four sides of the photosensitive chip 13. Optionally, more than two rows of the electronic components 12 may also be arranged on a same side of the photosensitive chip 13. Therefore, the relative arrangement of the electronic components 12 and the photosensitive chip 13 shown in FIGS. 2-7 are only for reference, and should not be regarded as a limitation to the content and scope of the camera module 1000 of the present invention.

The bonding portion 20 is ring-shaped and has a lower bonding side 21, a top bonding surface 22 corresponding to the lower bonding side 21, and a light path 23 extending from the top bonding surface 22 to the lower bonding side 21. The lower bonding side 21 of the bonding portion 20 is bonded to the circuit board assembly 10, and the bonding portion 20 surrounds the photosensitive area 131 of the photosensitive chip 13; a plane on which the top bonding surface 22 of the bonding portion 20 is located is higher than a plane on which the photosensitive area 131 of the photosensitive chip 13 is located, and the photosensitive area 131 of the photosensitive chip 13 corresponds to the light path 23 of the bonding portion 20. Periphery of the light filter 30 is bonded to the top bonding surface 22 of the bonding portion 20, so that the light filter 30 is kept in the photosensitive path of the photosensitive chip 13. The optical lenses 40 is kept in the photosensitive path of the photosensitive chip 13. In this preferred example of the camera module 1000 of the present invention shown in FIGS. 7-8, the bonding portion 20 is in a shape of a square ring, i.e., the bonding portion 20 has four sides 24, wherein two adjacent sides 24 are connected end to end and perpendicular to each other, so that the light path 23 is formed between the bonding portions 20 formed by the four sides 24. Each side 24 of the bonding portion 20 is respectively located outside the photosensitive area 131 of the photosensitive chip 13.

Preferably, the lower bonding side 21 of the bonding portion 20 is bonded to the non-photosensitive area 132 of the photosensitive chip 13, and the bonding portion 20 extends upward from the non-photosensitive area 132 of the photosensitive chip 13 to a suitable height, and forms the top bonding surface 22 of the bonding portion 20; and the top bonding surface 22 of the bonding portion 20 corresponds to the non-photosensitive area 132 of the photosensitive chip 13; in this way, a flatness of the top bonding surface 22 of the bonding portion 20 may be ensured by the non-photosensitive area 132 of the photosensitive chip 13, thereby ensuring the flatness between the light filter 30 and the photosensitive area 131 of the photosensitive chip 13.

A distance size (parameter H) between the plane on which the top bonding surface 22 of the bonding portion 20 is located and the plane on which the photosensitive area 131 of the photosensitive chip 13 is located is greater than or equal to 0.15 mm. In this way, it is beneficial for reducing generation of stray light and imaging of dirty spots, thereby improving the imaging quality of the camera module 1000.

A width size (parameter W) of the side 24 of the bonding portion 20 is greater than or equal to 0.15 mm. In this way, packaging tolerances may be compensated, so that the light filter 30 is reliably supported in the photosensitive path of the photosensitive chip 13 by the bonding portion 20.

In the present invention, the circuit board assembly 10, the bonding portion 20, and the light filter 30 form a photosensitive assembly, i.e., the camera module 1000 includes the photosensitive assembly and the optical lenses 40 which is kept in the photosensitive path of the photosensitive chip 13, and the light entering the inside of the camera module 1000 from the optical lenses 40 may be received by the photosensitive chip 13 and photo-electrically converted.

Further to refer to FIGS. 7-8, the camera module 1000 further includes a lenses holder 50 and a lenses bearing portion 60 mounted on the lenses holder 50. The lenses holder 50 has a lower surface 51, an upper surface 52 corresponding to the lower surface 51, and an inner surface 53 extending from the upper surface 52 to the lower surface 51. The lower surface 51 of the lenses holder 50 is integrally bonded to the circuit board 11 and the non-photosensitive area 132 of the photosensitive chip 13, and the inner surface 53 of the lenses holder 50 is integrally bonded to the bonding portion 20. The optical lenses 40 is arranged on the lenses bearing portion 60, and the lenses bearing portion 60 has a mounting surface 61, wherein the lenses bearing portion 60 is mounted on the lenses holder 50 in such a manner that the mounting surface 61 of the lenses bearing portion 60 is mounted on the upper surface 52 of the lenses holder 50, so that the optical lenses 40 is kept in the photosensitive path of the photosensitive chip 13 by the lenses holder 50 and the lenses bearing portion 60.

The type of the lenses bearing portion 60 is selected according to the type of the camera module 1000. For example, when the camera module 1000 is a fixed-focus camera module, the lenses bearing portion 60 is selected as a lenses barrel. Correspondingly, when the camera module 1000 is a zoom camera module, the lenses bearing portion 60 is selected as a motor, such as but not limited to a voice coil motor.

Referring to FIG. 7, preferably, a parameter of a distance between the mounting surface 61 of the lenses bearing portion 60 and the lower surface of the light filter 30 is set as D, and a range of value of the parameter D is 0.1-0.2 mm (including 0.1 mm and 0.2 mm) to help reduce the size in height of the camera module 1000. It is worth mentioning that, in the camera module 1000 of the present invention, the light filter 30 is kept in the photosensitive path of the photosensitive chip 13 by the bonding portion 20, and the lenses bearing portion 60 is mounted on the lenses holder 50, so that compared to the camera module in prior art, in this preferred example of the camera module 1000 of the present invention, the distance between the mounting surface 61 of the lenses bearing portion 60 and the lower surfaces of the light filter 30 may be smaller, which is particularly important for reducing the size in height of the camera module 1000.

Further referring to FIG. 7, in this preferred example of the camera module 1000 according to the present invention, the light filter 30 is kept in the photosensitive path of the photosensitive chip 13 by the bonding portion 20, and the lenses bearing portion 60 is mounted on the lenses holder 50 so that the optical lenses 40 is kept in the photosensitive path of the photosensitive chip 13 by the lenses bearing portion 60 and the lenses holder 50. Since the lenses holder 50 does not need to keep the light filter 30 in the photosensitive path of the photosensitive chip 13, a height of the upper surface 52 of the lenses holder 50 (the distance from the upper surface 52 to the photosensitive chip 13) may be reduced, thereby reducing a distance between the optical lenses 40 and the photosensitive area 131 of the photosensitive chip 13. In this way, a back focus size of the camera module 1000 may be reduced, thereby facilitating to reduce the size in height of the camera module 1000. The back focal length of the camera module 1000 refers to a distance between a surface of a lens of the optical lenses 40 which is closest to the photosensitive chip 13 and the photosensitive area 131 of the photosensitive chip 13. A parameter of the back focal length of the camera module 1000 is set as L, wherein a range of value of the parameter L is 0.4-0.6 mm (including 0.4 mm and 0.6 mm), as compared with the back focal length of 0.8 mm in the camera module of prior art, the back focal length of the camera module 1000 according to the present invention may be reduced by a large value, thereby facilitating to reduce the size in height of the camera module 1000.

Optionally, in an example of the camera module 1000, the lenses bearing portion 60 and the lenses holder 50 may be an integrated structure. In another example of the camera module 1000, the camera module 1000 may not be configured with the lenses bearing portion 60. In this case, the camera module 1000 keeps the optical lenses 40 in the photosensitive path of the photosensitive chip 13 by directly mounting the optical lenses 40 on the lenses holder 50.

In the camera module 1000 shown in FIGS. 7-8, the lenses holder 50 is not prefabricated, wherein the lenses holder 50 may be integrally formed by a molding process and bonded to the circuit board assembly 10 and the bonding portion 20, thereby allowing the lower surface 51 of the lenses holder 50 to be integrally bonded to the circuit board 11 and the non-photosensitive area 132 of the photosensitive chip 13, and allowing the inner surface 53 of the lenses holder 50 to be integrally bonded to the bonding portion 20. In this way, the reliability for bonding the lenses holder 50 to the circuit board 11, the photosensitive chip 13, and the bonding portion 20 is higher, thereby facilitating to ensure the stability and reliability of the camera module 1000. Optionally, the lenses holder 50 may be further integrally bonded to the peripheral edges of the light filter 30.

The camera module 1000 adopts a manner in which the lenses holder 50 is integrally bonded to the circuit board 11 and the non-photosensitive area 132 of the photosensitive chip 13, so that the packaging process of the camera module 1000 no longer requires the lenses holder 50 to be prefabricated, thereby facilitating to reduce the cost and risk of the management and control of the components of the camera module 1000.

The camera module 1000 adopts a manner in which the lenses holder 50 is integrally bonded to the circuit board 11 and the non-photosensitive area 132 of the photosensitive chip 13; this is not only beneficial to ensure the reliability of the bonding relationship of the circuit board 11 and the photosensitive chip 13, and the flatness of the photosensitive chip 13 is no longer limited by the flatness of the circuit board 11; wherein the flatness of the photosensitive chip 13 is ensured by the lenses holder 50, thereby facilitating to ensure the flatness of the photosensitive chip 13. Particularly, in such a manner that the lenses holder 50 is integrally bonded to the circuit board 11 and the non-photosensitive area 132 of the photosensitive chip 13 through a molding die, the top surface of the lenses holder 50 may be made flatter and is not affected by the inclination or deformation of the circuit board 11, so as to reduce cumulative tolerances during the subsequent assembly; in this way, it is beneficial to ensure the coaxiality of the optical lenses 40 and the photosensitive chip 13.

The camera module 1000 adopts a manner in which the lenses holder 50 is integrally bonded to the circuit board 11 and the non-photosensitive area 132 of the photosensitive chip 13, so that the lenses holder 50 ensures the flatness of the photosensitive chip 13; in this way, a thinner size may be selected for the circuit board 11, thereby facilitating to reduce the size in height of the camera module 1000. Particularly, in such a manner that the lenses holder 50 is integrally bonded to the circuit board 11 through a molding process, the lenses holder 50 may reinforce the circuit board 11, so that the circuit board 11 may be thinner under the premise of ensuring the flatness of the circuit board 11, and this is beneficial to reduce the overall size in height of the camera module 1000.

The camera module 1000 adopts the manner in which the lenses holder 50 is integrally bonded to the circuit board 11 and the non-photosensitive area 132 of the photosensitive chip 13, and this may avoid using glue to mount the lenses holder 50 on the circuit board 11, thereby facilitating to reduce the height size of the camera module 1000.

Referring to FIG. 7, the camera module 1000 adopts a manner in which the light filter 30 is kept in the photosensitive path of the photosensitive chip 13 by the bonding portion 20. On one hand, the cost of the camera module 1000 may be reduced by reducing the size of the light filter 30; on the other hand, the lower surface of the light filter 30 (the surface of the light filter 30 facing the photosensitive chip 13) may be lower than the height of the top surface of the highest electronic component 12. In this way, in conjunction with the improvement in the optical design of the camera module 1000, and after reducing the back focus of the camera module 1000, the light filter 30 of the camera module 1000 may be closer to the photosensitive chip 13, so that the optical lenses 40 has the possibility of being adjusted toward the direction of the photosensitive chip 13, thereby facilitating to reduce the height size of the camera module 1000.

FIGS. 2-7 show the packaging process of the camera module 1000.

Figure 2:
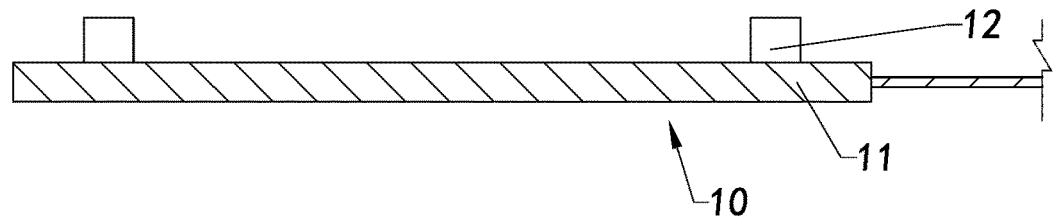
FIG. 2 is a schematic sectional view of the first manufacturing processes of a camera module according to the first preferred embodiment of the present invention.

Referring to FIG. 2, a set of the electronic components 12 are mounted on the circuit board 11. The type of the electronic component 12 is not limited in the camera module 1000 of the present invention. For example, the electronic component 12 may be, but not limited to, a resistor, a capacitor, a controller, and the like.

Figure 3:
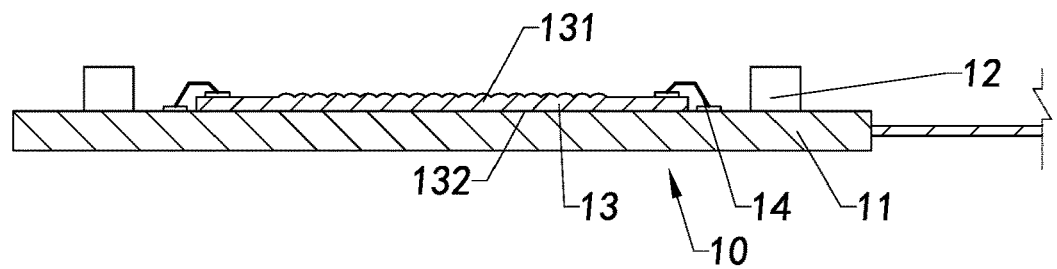
FIG. 3 is a schematic sectional view of the second manufacturing process of the camera module according to the above preferred embodiment of the present invention.

Referring to FIG. 3, the photosensitive chip 13 is mounted on the circuit board 11, and at least one set of guiding wires 14 with the two ends being conductively connected to the photosensitive chip 13 and the circuit board 11 respectively are formed by a wire bonding process, so as to form the circuit board assembly 10.

It is worth mentioning that, the stage shown in FIG. 3 may be prior to the stage shown in FIG. 2, i.e., firstly the photosensitive chip 13 is mounted on the circuit board 11, and then a set of the electronic components 12 are mounted on the circuit board 11 to form the circuit board assembly 10.

Figure 4:
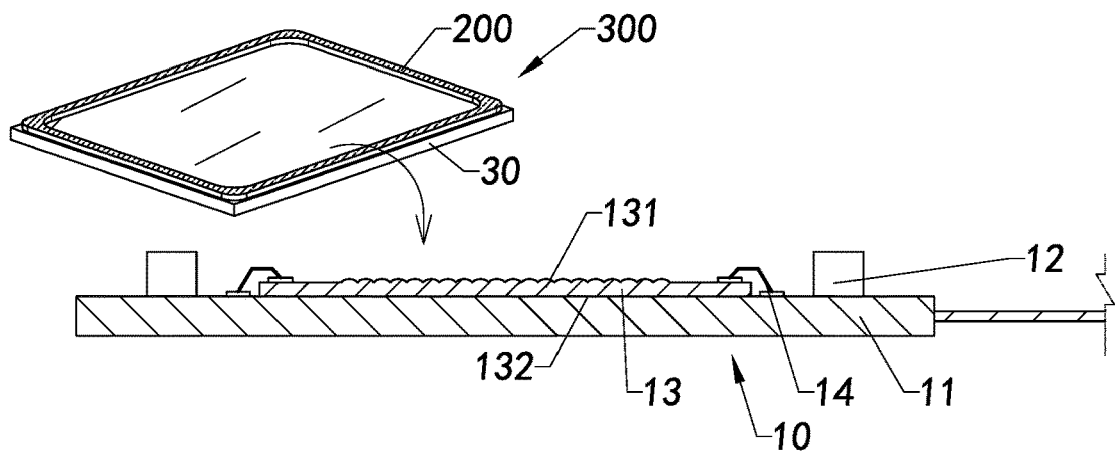
FIG. 4 is a three-dimensional schematic diagram of the third manufacturing process of the camera module according to the above preferred embodiment of the present invention.

Referring to FIG. 4, a ring-shaped boss 200 is formed around one side portion of the light filter 30, so as to form a light filter 300 with a ring-shaped boss. For example, in the preferred example of the camera module 1000 shown in FIGS. 7-8, the ring-shaped boss 200 may be formed around one side portion of the light filter 30 through a screen printing process, so as to form the light filter 300 with the ring-shaped boss. Optionally, the ring-shaped boss 200 may also be formed around one side portion of the light filter 30 through a photolithography process, so as to form the light filter 300 with the ring-shaped boss. The material for forming the ring-shaped boss 200 may be, but is not limited to, colloid.

It is worth mentioning that, the sequence of forming the circuit board assembly 10 and forming the light filter 300 with the ring-shaped boss is not limited.

Figure 5:
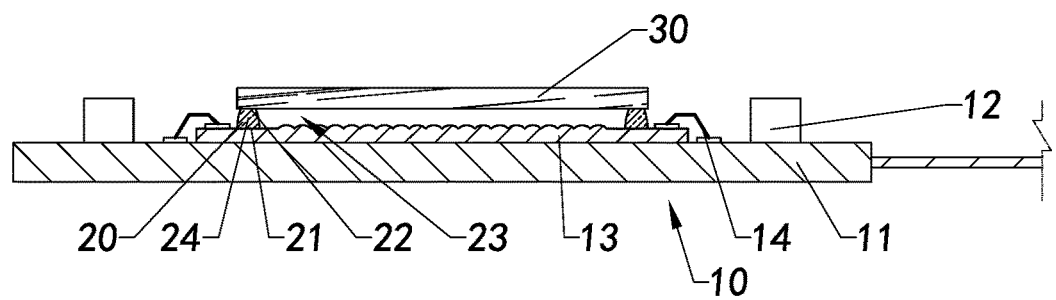
FIG. 5 is a schematic sectional view of the fourth manufacturing process of the camera module according to the above preferred embodiment of the present invention.

Referring to FIG. 5, firstly, the light filter 300 with the ring-shaped boss is mounted on the circuit board assembly 10, wherein the ring-shaped boss 200 is mounted on the non-photosensitive area 132 of the photosensitive chip 13; for example, in an example, if the material of the ring-shaped boss 200 is a colloidal material, the ring-shaped boss 200 may be directly mounted on the non-photosensitive area 132 of the photosensitive chip 13; in another example, if the material of the ring-shaped boss 200 is non-colloid, it is necessary to mount the ring-shaped boss 200 on the non-photosensitive area 132 of the photosensitive chip 13 by glue or a similar substance; secondly, the ring-shaped boss 200 is cured, so that the ring-shaped boss 200 forms the bonding portion 20, and the light filter 30 is kept in the photosensitive path of the photosensitive chip 13 by the bonding portion 20, wherein the surface of the ring-shaped boss 200 bonded to the photosensitive chip 13 forms the lower bonding side 21 of the bonding portion 20, and the surface of the ring-shaped boss 200 bonded to the light filter 30 forms the top bonding surface 22 of the bonding portion 20, and a hollow portion in the middle of the ring-shaped boss 200 forms the light path 23 of the bonding portion 20.

It is worth mentioning that, the way of curing the ring-shaped boss 200 is not limited, and it is selected according to the material for forming the ring-shaped boss 200. For example, the ring-shaped boss 200 may be cured by heating or irradiation with ultraviolet light, so as to form the bonding portion 20.

Figure 6:
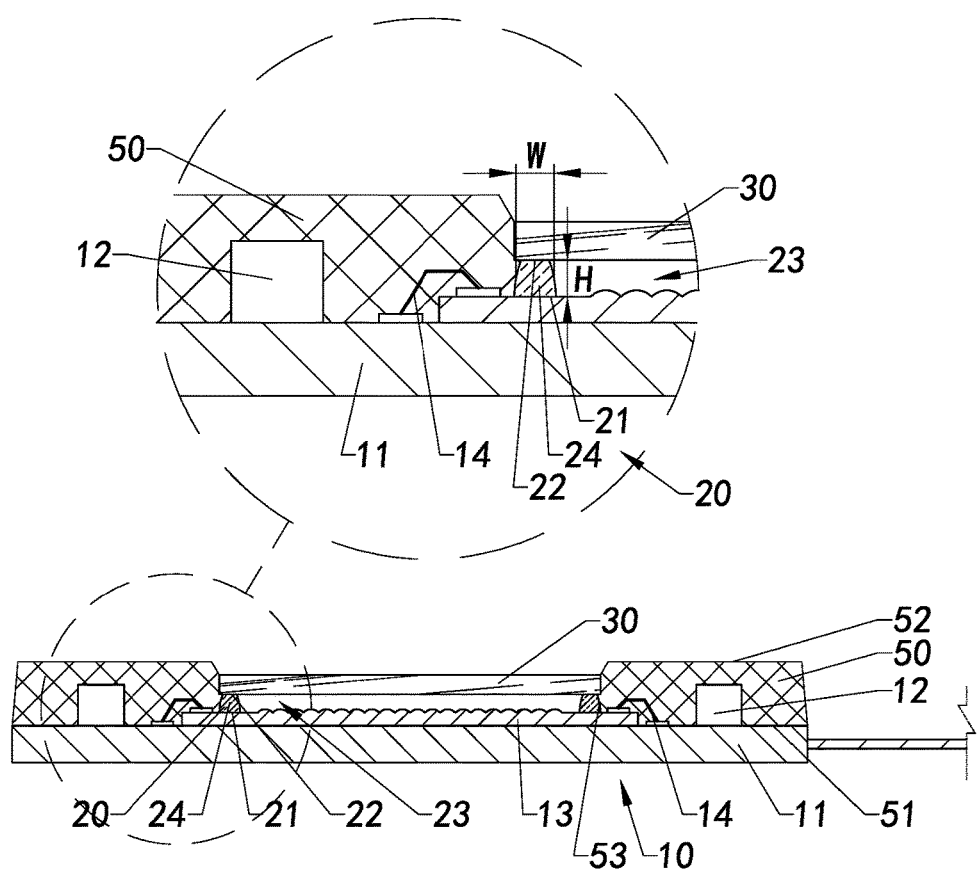
FIG. 6 is a schematic sectional view of the fifth manufacturing process of the camera module according to the above preferred embodiment of the present invention.

Referring to FIG. 6, the lenses holder 50 is formed on the circuit board assembly 10 and the bonding portion 20 through a molding process, so that the lower surface 51 of the lenses holder 50 is integrally bonded to the circuit board 11 and the photosensitive chip 13 of the circuit board assembly 10, and the inner surface 53 of the lenses holder 50 is integrally bonded to the bonding portion 20. Preferably, the lenses holder 50 embeds the electronic components 12 and the guiding wires 14 protruding from the circuit board 11; in this way, firstly, there is no need to reserve a safe space between the lenses holder 50 and the electronic components 12, thereby facilitating to reduce the height size of the camera module 1000; secondly, the lenses holder 50 prevents the electronic components 12 from being exposed, thereby preventing the pollutants such as debris falling off the surface of the electronic components 12 from contaminating other electronic components 12 or contaminating the photosensitive chip 13; thirdly, the upper surface 52 of the lenses holder 50 has a higher flatness, so that after the optical lenses 40 is kept in the photosensitive path of the photosensitive chip 13 by mounting the lenses bearing portion 60 on the upper surface 52 of the lenses holder 50, the central axis of the optical lenses 40 and the central axis of the photosensitive area 131 of the photosensitive chip 13 may be overlapped, so as to ensure the imaging quality of the camera module 1000; fourthly, the lenses holder 50 may be filled in the space between the adjacent electronic components 12, so as to isolate the adjacent electronic components 12 and prevent the adjacent electronic components 12 from interfering with each other. In this way, a distance between the adjacent electronic components 12 may be smaller, so that the camera module 1000 may be equipped with a larger number and larger size of the electronic components 12.

Referring to FIGS. 7-8, the optical lenses 40 is mounted on the lenses bearing portion 60, and the lenses bearing portion 60 is mounted on the upper surface 52 of the lenses holder 50, so as to keep the optical lenses 40 in the photosensitive path of the photosensitive chip 13, thereby manufacturing the camera module 1000.

Optionally, in another manufacturing process of the camera module 1000, firstly, the ring-shaped boss 200 is formed in the non-photosensitive area 132 of the photosensitive chip 13 by a screen printing process or a photolithography process; secondly, the light filter 30 is mounted on the ring-shaped boss 200, for example, glue or similar substance may be used to mount the light filter 30 on the ring-shaped boss 200; then, the ring-shaped boss 200 is cured, so that the ring-shaped boss 200 forms the bonding portion 20, and the light filter 30 is kept in the photosensitive path of the photosensitive chip 13 by the bonding portion 20, wherein a surface for bonding the ring-shaped boss 200 to the photosensitive chip 13 forms the lower bonding side 21 of the bonding portion 20, a surface for bonding the ring-shaped boss 200 to the light filter 30 forms the top bonding surface 22 of the bonding portion 20, and the hollow portion in the middle of the ring-shaped boss 200 forms the light path 23 of the bonding portion 20.

Figure 9:
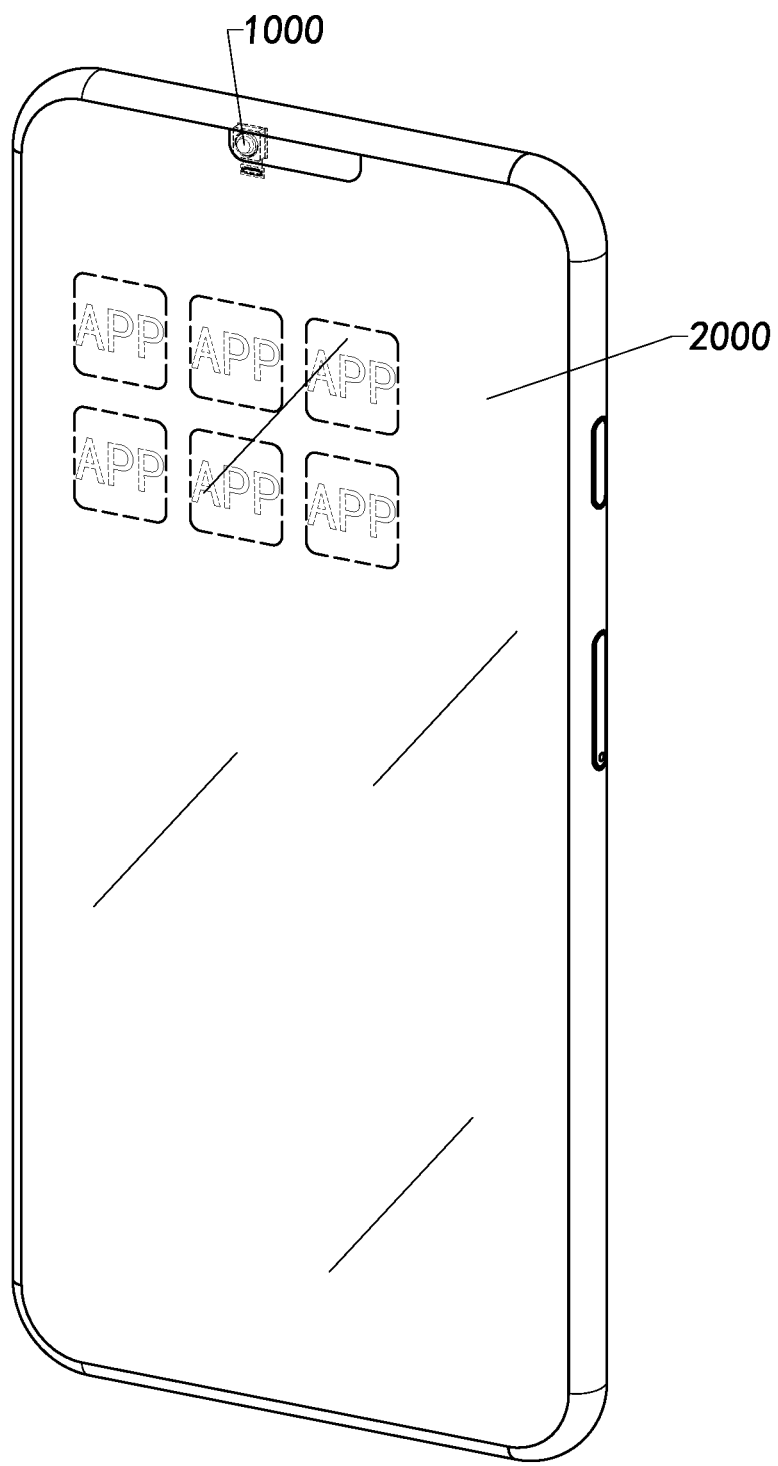
FIG. 9 is a three-dimensional schematic diagram of an application state of the camera module according to the above preferred embodiment of the present invention.

FIG. 9 shows an application state of the camera module 1000, wherein the camera module 1000 is arranged in an electronic device body 2000, so that the electronic device body 2000 and the camera module 1000 form an electronic device. It is worth mentioning that, the example in which the electronic device is a smart phone shown in FIG. 9 is only an example, which does not limit the application scope of the camera module 1000 according to the present invention. For example, the types of the electronic device may be, but are not limited to, a tablet computer, a notebook computer, a personal digital assistant, and a MP3/4/5.

Figure 10:
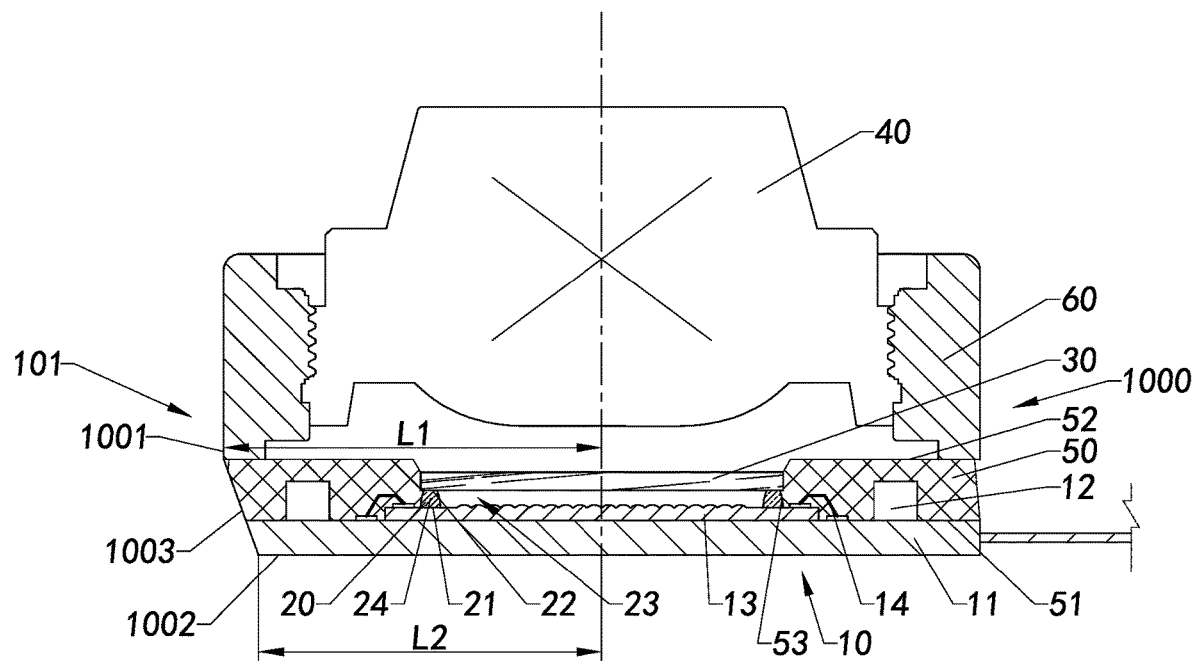
FIG. 10 is a schematic sectional view of a modified implementation of the camera module, according to the above preferred embodiment of the present invention.
Figure 11A:
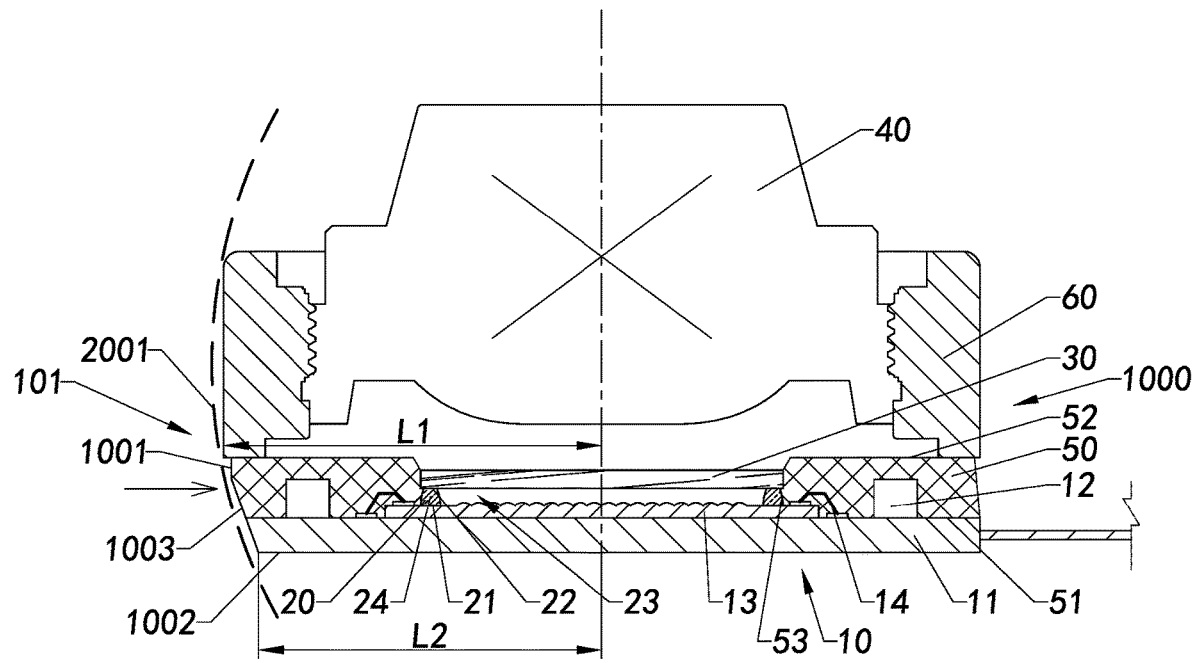
FIG. 11A is a schematic sectional view of an application state of the camera module according to the above preferred embodiment of the present invention.
Figure 11B:
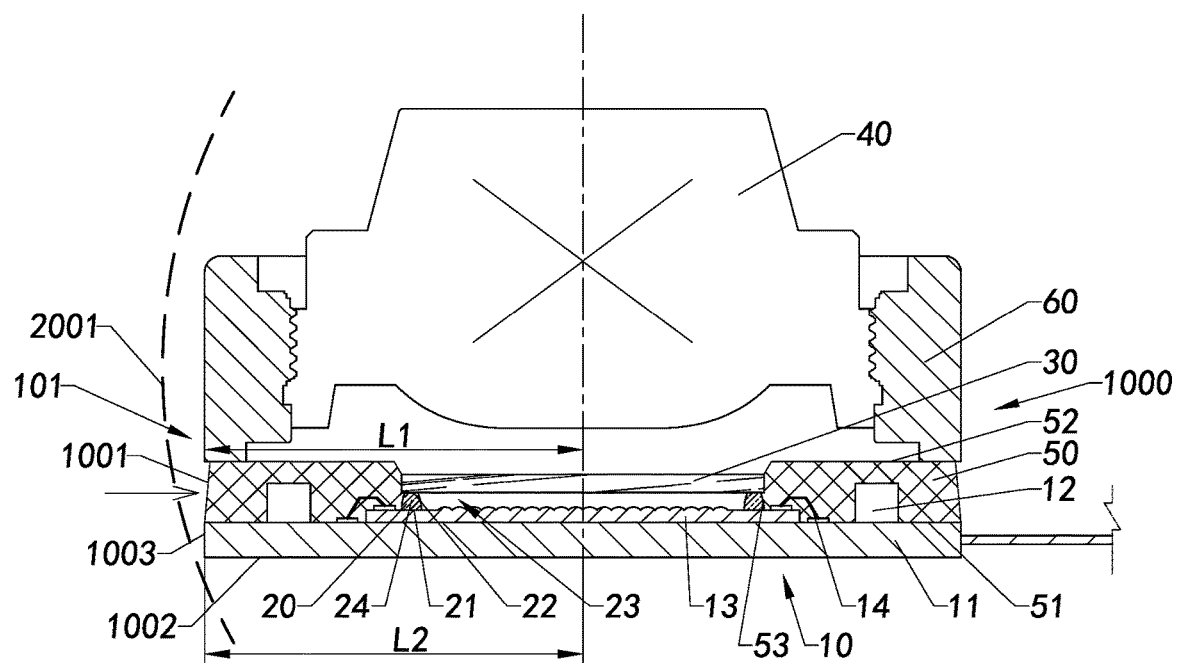
FIG. 11B is a sectional view of an application state of the camera module in the prior art.

FIG. 10 shows a modified implementation of the camera module 1000, and FIG. 11A shows an application state of the camera module 1000. The difference from the camera module 1000 shown in FIGS. 7-8 is that: in this specific example of the camera module 1000 shown in FIG. 10, the camera module 1000 has four side portions 101, wherein at least one side portion 101 of the camera module 1000 further has a side surface 1011, a bottom surface 1012, and a connecting surface 1013 connected to the side surface 1011 and the bottom surface 1012, and wherein a distance L1 from a connection position of the side surface 1011 and the connecting surface 1013 to a central axis of the camera module 1000 is greater than a distance L2 from a connection position of the bottom surface 1012 and the connecting surface 1013 to the central axis of the camera module 1000, so that at least one side portion 101 of the camera module 1000 has a retracting portion, so as to match a turning part of a housing of the electronic device body; in this way, the optical lenses 40 of the camera module 1000 may be closer to the edge of the housing 2001 of the electronic device body 2000, thereby facilitating to increase the screen-to-body ratio of the electronic device. Particularly, comparing to the relationship between the camera module and the housing of the electronic device in the prior art shown in FIG. 11B, it can be seen that the distance between the camera module 1000 of the present invention and the edge of the housing 2001 of the electronic device body 2000 is smaller, thereby facilitating to increase the screen-to-body ratio of the electronic device.

Figure 12A:
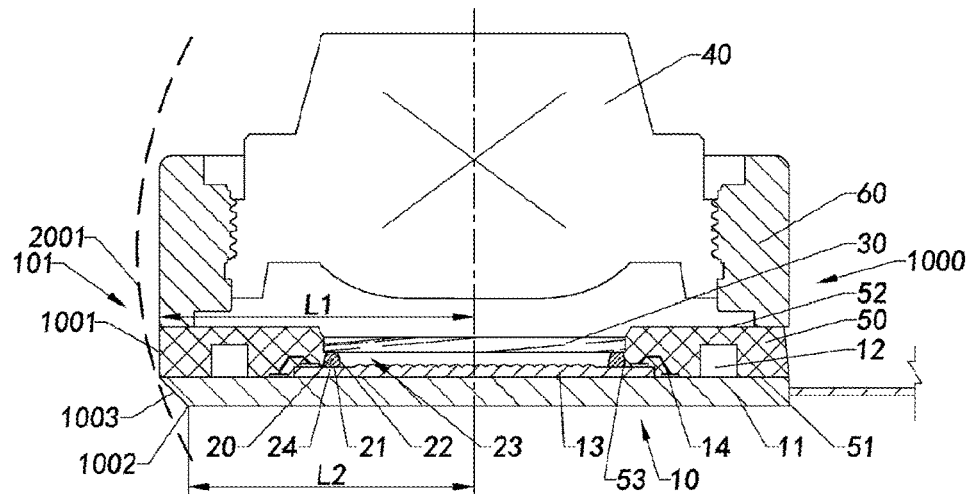
FIGS. 12A-12C are schematic diagrams of different states of a relationship between the camera module and a housing of an electronic device body according to the above preferred embodiment of the present invention.
Figure 12B:
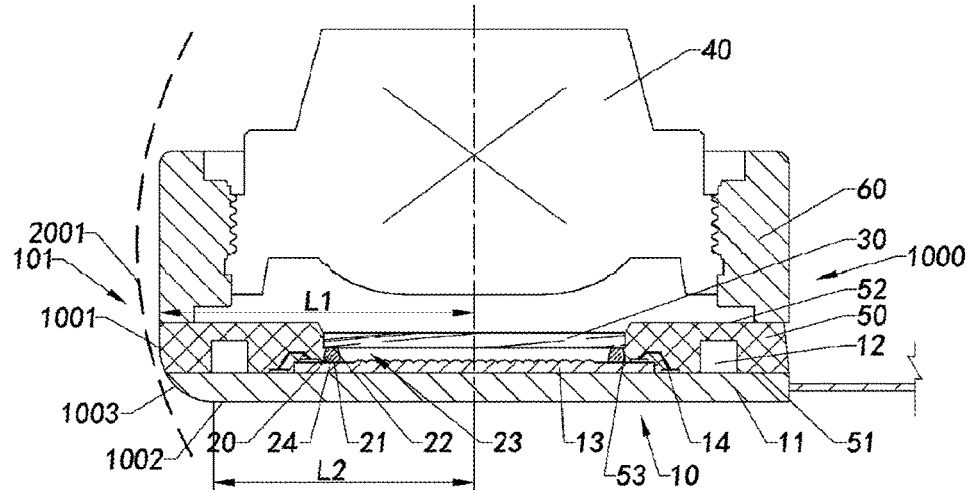
Figure 12C:
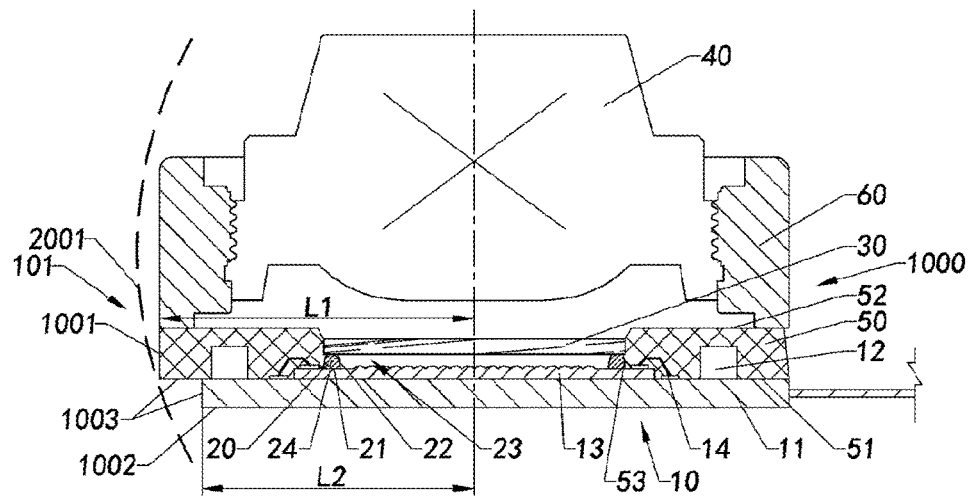
Figure 13:
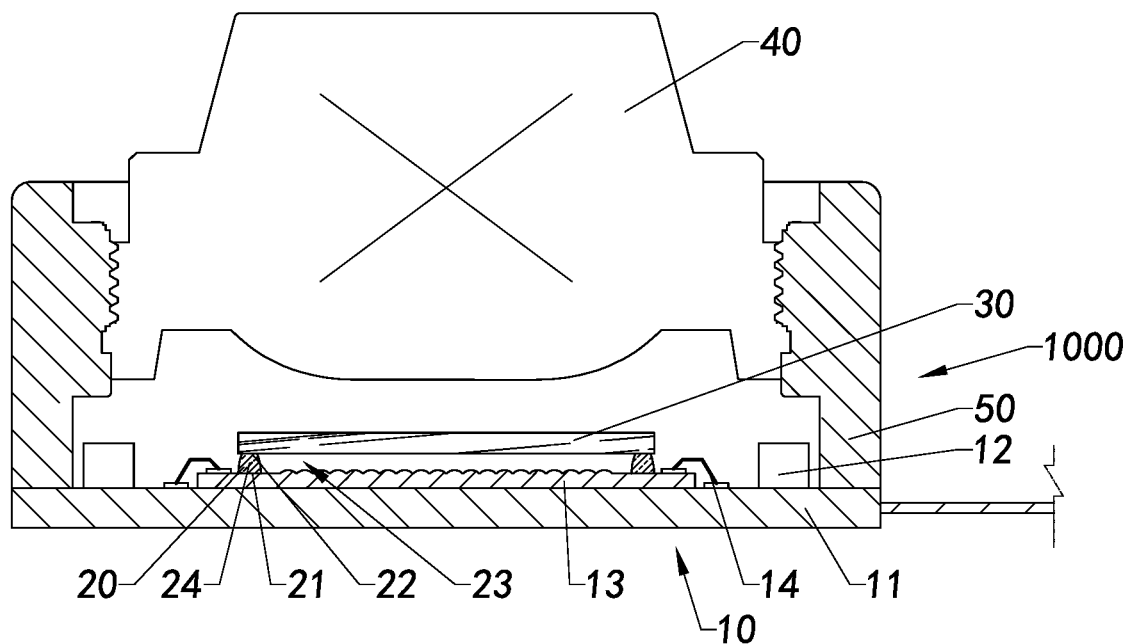
FIG. 13 is a schematic sectional view of another modified implementation of the camera module according to the above preferred embodiment of the present invention.

FIG. 12A shows a relationship between the camera module 1000 and the housing 2001 of the electronic device body 2000 after the camera module 1000 is arranged in the electronic device body to form the electronic device, wherein a side portion 101 with a locking portion of the camera module 1000 corresponds to the turning part of the housing 2001 of the electronic device body 2000, so that the optical lenses 40 of the camera module 1000 may be closer to the edge of the housing 2001 of the electronic device body 2000, so as to increase the screen-to-body ratio of the electronic device. The connecting surface 1013 of the camera module 1000 is an inclined plane, referring to FIG. 12A; or the connecting surface 1013 of the camera module 1000 is a convex curved surface, referring to FIG. 12B; wherein the connecting surface 1013 of the camera module 1000 may be formed by removing a part of the circuit board 11 and/or a part of the lenses holder 50. For example, a part of the circuit board 11 and a part of the lenses holder 50 may be removed by cutting or grinding the circuit board 11 and/or the lenses holder 50. Optionally, the connecting surface 1013 of the camera module 1000 is a step surface, referring to FIG. 12C; wherein the connecting surface 1013 of the camera module 1000 may be formed by retracting the circuit board 11 in the process of packaging the camera module 1000. Optionally, the connecting surface 1013 of the camera module 1000 may also be formed by removing a part of the circuit board 11 or removing a part of the circuit board 11 and the lenses holder 50 after the camera module 1000 is packaged FIG. 13 shows another modified implementation of the camera module 1000. The difference from the camera module 1000 shown in FIGS. 2 to 8 is that: in this preferred example of the camera module shown in FIG. 13, the camera module 1000 does not have the lenses bearing portion 60, wherein the lenses holder 50 is mounted on the circuit board 11 of the circuit board assembly 10, and the optical lenses 40 is mounted on the lenses holder 50, so that the optical lenses 40 is kept in the photosensitive path of the photosensitive chip 13 by the lenses holder 50.

Referring to FIGS. 14-20 of the accompanying drawings of the specification according to the present invention, a camera module 1000 according to the second preferred embodiment of the present invention is disclosed and explained in the following description, wherein the camera module 1000 includes a circuit board assembly 10, a bonding portion 20, a light filter 30, and an optical lenses 40.

Figure 19:
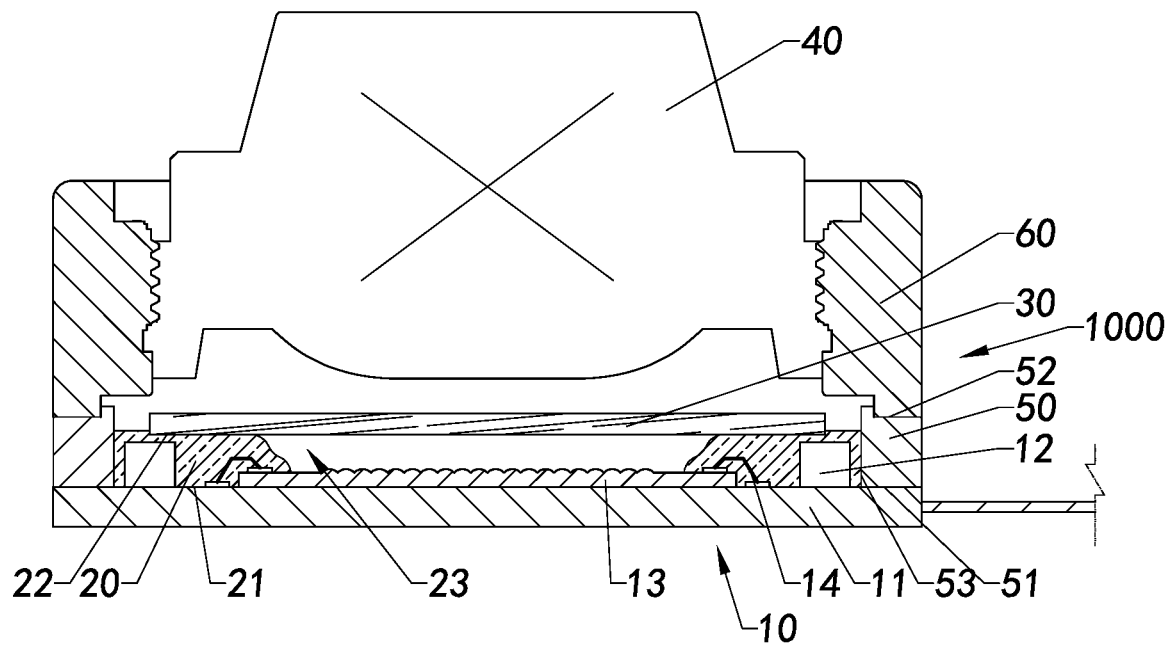
FIG. 19 is a schematic sectional view of the sixth manufacturing process of the camera module according to the above preferred embodiment of the present invention, which shows a sectional view state of the camera module after being cut along a middle position.
Figure 20:
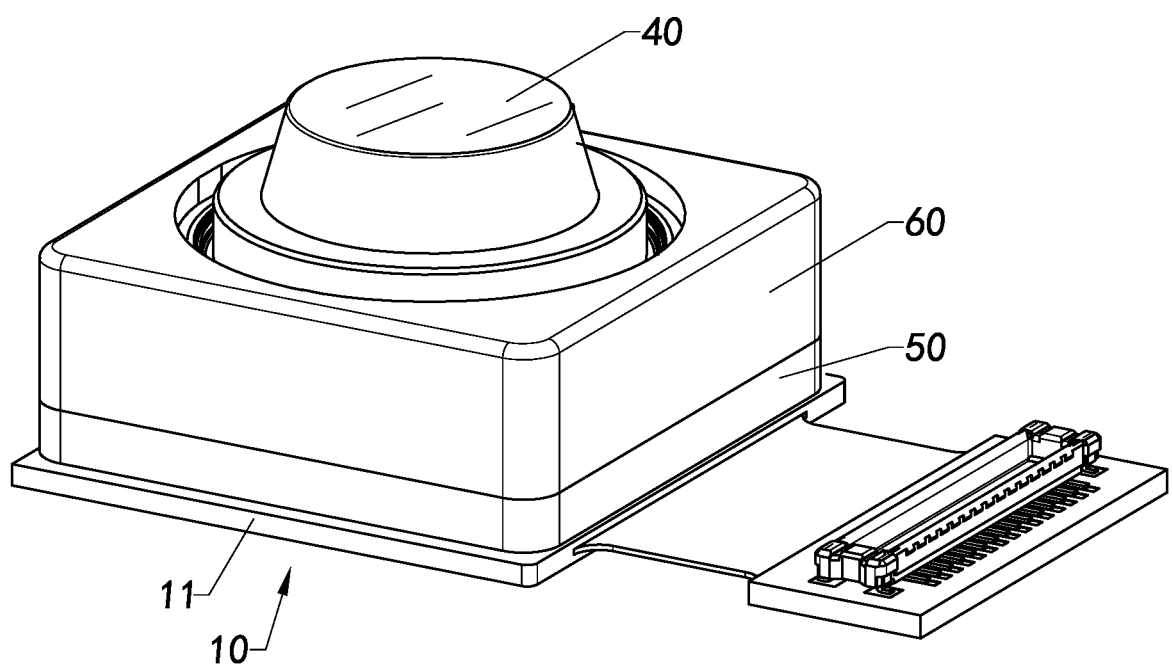
FIG. 20 is a three-dimensional schematic diagram of the camera module according to the above preferred embodiment of the present invention.

Referring to FIGS. 19-20, the circuit board assembly 10 includes a circuit board 11 and a set of electronic components 12 conductively connected to the circuit board 11, and there is a gap between the adjacent electronic components 12. The manner in which the electronic component 12 is conductively connected to the circuit board 11 is not limited; for example, in the specific example of the camera module 1000 shown in FIGS. 19-20, the electronic component 12 is conductively connected to the circuit board 11 by being mounted on the surface of the circuit board 11. Optionally, the electronic component 12 is conductively connected to the circuit board 11 in such a manner that at least a part of it is embedded inside the circuit board 11.

Further referring to FIGS. 19-20, the circuit board assembly 10 further includes a photosensitive chip 13 which has a photosensitive area 131 and a non-sensitive area 132 surrounding the photosensitive area 131, wherein the photosensitive chip 13 is conductively connected to the circuit board 11. In addition, a height difference between the photosensitive area 131 and the non-photosensitive area 132 of the photosensitive chip 13 is not limited to a height difference shown in FIGS. 15-19. The way of conductively connecting the photosensitive chip 13 to the circuit board 11 is not limited; for example, in the specific example of the camera module 1000 shown in FIGS. 19-20, the photosensitive chip 13 is mounted on the surface of the circuit board 11, and two ends of at least one set of guiding wires 14 formed by a wire bonding process are conductively connected to the photosensitive chip 13 and the circuit board 11 respectively, so that the photosensitive chip 13 is conductively connected to the circuit board 11. Optionally, the photosensitive chip 13 is mounted on the circuit board 11 by a flip-chip process and conductively connected to the circuit board 11.

Particularly, in the camera module 1000 shown in FIGS. 19-20, a set of the electronic components 12 form two rows of the electronic components 12, wherein one row of the electronic components 12 are located on the left side of the photosensitive chip 13, and the other row of the electronic component 12s are located on the right side of the photosensitive chip 13. Optionally, a set of the electronic components 12 form three rows of the electronic components 12, wherein the three rows of the electronic components 12 are respectively located on three sides of the photosensitive chip 13. Optionally, a set of the electronic components 12 form four rows of the electronic components 12, wherein the four rows of the electronic components 12 are respectively located on four sides of the photosensitive chip 13. Optionally, more than two rows of the electronic components 12 may also be arranged on the same side of the photosensitive chip 13. Therefore, the relative arrangement of the electronic components 12 and the photosensitive chip 13 shown in FIGS. 2-7 are only for reference, and should not be regarded as a limitation to the content and scope of the camera module 1000 of the present invention.

The bonding portion 20 is ring shaped and has a lower bonding side 21, a top bonding surface 22 corresponding to the lower bonding side 21, and a light path 23. The lower bonding side 21 of the bonding portion 20 is bonded to the circuit board assembly 10, and the bonding portion 20 surrounds the photosensitive area 131 of the photosensitive chip 13, so that the photosensitive area 131 of the photosensitive chip 13 is exposed to the light path 23 of the bonding portion 20; and a plane on which the top bonding surface 22 of the bonding portion 20 is located is higher than a plane on which the photosensitive area 131 of the photosensitive chip 13 is located. Periphery of the light filter 30 is bonded to the top bonding surface 22 of the bonding portion 20, so that the light filter 30 is kept in the photosensitive path of the photosensitive chip 13. The optical lenses 40 are kept in the photosensitive path of the photosensitive chip 13. In the camera module 1000 of the present invention, the bonding portion 20 is in a shape of a square ring, i.e., the bonding portion 20 has four sides 24, wherein two adjacent sides 24 are connected end to end and perpendicular to each other, so that the photosensitive path 24 is formed between the bonding portions 20 formed by the four sides 24. Each side 24 of the bonding portion 20 is respectively located outside the photosensitive area 131 of the photosensitive chip 13.

Preferably, referring to FIG. 19, the lower bonding side 21 of the bonding portion 20 is bonded to the circuit board 11 of the circuit board assembly 10, the electronic component 12, the guiding wire 14 and the non-photosensitive area 132 of the photosensitive chip 13; the bonding portion 20 extends upward from the circuit board assembly 10 to a suitable height, and forms the top bonding surface 22 of the bonding portion 20; and the top bonding surface 22 of the bonding portion 20 corresponds to the electronic components 12 arranged at a same height; in this way, a flatness of the top bonding surface 22 of the bonding portion 20 may be ensured by the electronic components 12 arranged at the same height, thereby ensuring a flatness between the light filter 30 and the photosensitive area 131 of the photosensitive chip 13.

Figure 21:
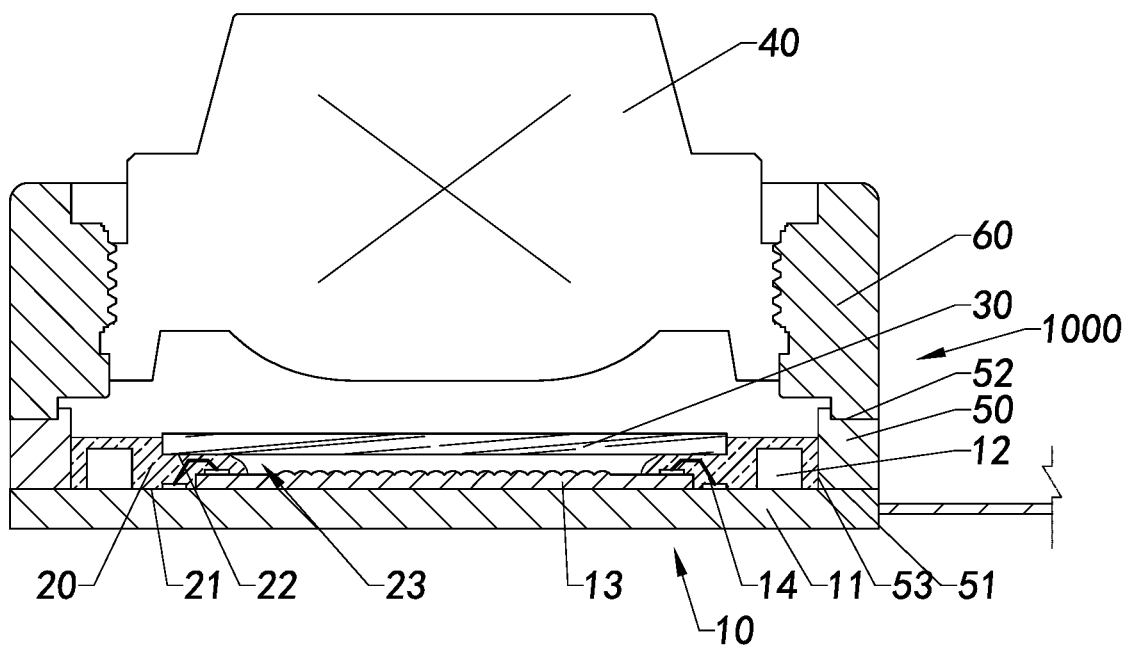
FIG. 21 is a schematic sectional view of a first modified implementation of the camera module according to the above preferred embodiment of the present invention.

Optionally, referring to FIG. 21, the top bonding surface 22 of the bonding portion 20 may also correspond to the non-photosensitive area 132 of the photosensitive chip 13; in this way, the flatness of the top bonding surface 22 of the bonding portion 20 may be ensured by the non-photosensitive area 132 of the photosensitive chip 13, thereby ensuring the flatness between the light filter 30 and the photosensitive area 131 of the photosensitive chip 13. Further referring to FIG. 21, a height of the top bonding surface 22 of the bonding portion 20 may be lower than the highest position of the bonding portion 20, for example, the height of the top bonding surface 22 of the bonding portion 20 may be lower than the height of the electronic component 12; in this way, in conjunction with the improvement in the optical design of the camera module 1000, the back focus of the camera module 1000 may be reduced, thereby further reducing the height size of the camera module 1000. In addition, the manner in which the light filter 30 of the camera module 1000 according to the present invention is further closer to the photosensitive chip 13 allows the optical lenses 40 to have the possibility of being adjusted toward the direction of the photosensitive chip 13, thereby facilitating to reduce the height size of the camera module 1000.

Further referring to FIG. 19, in the camera module 1000 according to the present invention, the types of the electronic components 12 may be, but are not limited to, a resistor, a capacitor, a controller or the like. Generally, different types of electronic components 12 have different height sizes. Therefore, in order to ensure that at least three of the electronic components 12 may be arranged at the same height, when these electronic components 12 are conductively connected to the circuit board 11, the electronic components 12 with larger height size may be half embedded in the circuit board 11, and the electronic components 12 with smaller height size are mounted on the surface of the circuit board 11, so that these electronic components 12 are arranged at the same height; alternatively, when these electronic components 12 are conductively connected to the circuit board 11, the electronic components 12 with larger height size may be mounted on the surface of the circuit board 11, and the height of the electronic components 12 with smaller height size may be adjusted through an additional structure, so that these electronic components 12 are arranged at the same height.

It is worth mentioning that, when the height of the electronic component 12 with a smaller height size is adjusted by the additional structure, the additional structure may be arranged between the electronic component 12 and the circuit board 11, or may also be arranged on the top of the electronic component 12.

A distance size (parameter H) between the plane on which the top bonding surface 22 of the bonding portion 20 is located and the plane on which the photosensitive area 131 of the photosensitive chip 13 is located is greater than or equal to 0.15 mm. In this way, it is beneficial for reducing the generation of stray light and the imaging of dirty spots, thereby improving the imaging quality of the camera module 1000.

In the present invention, the circuit board assembly 10, the bonding portion 20, and the light filter 30 form a photosensitive assembly, i.e., the camera module 1000 includes the photosensitive assembly and the optical lenses 40 which is kept in the photosensitive path of the photosensitive chip 13 of the photosensitive assembly, wherein the light entering the inside of the camera module 1000 from the optical lenses 40 may be received by the photosensitive chip 13 and photo-electrically converted.

Further referring to FIGS. 19-20, the camera module 1000 further includes a lenses holder 50 and a lenses bearing portion 60 mounted on the lenses holder 50. The lenses holder 50 has a lower surface 51, an upper surface 52 corresponding to the lower surface 51, and an inner surface 53 extending from the upper surface 52 to the lower surface 51. The lower surface 51 of the lenses holder 50 is mounted on the circuit board 11, and the inner surface 53 of the lenses holder 50 is bonded to the bonding portion 20. The optical lenses 40 is arranged on the lenses bearing portion 60, and the lenses bearing portion 60 is mounted on the upper surface 52 of the lenses holder 50, so that the optical lenses 40 is kept in the photosensitive path of the photosensitive chip 13 by the lenses holder 50 and the lenses bearing portion 60.

The type of the lenses bearing portion 60 is selected according to the type of the camera module 1000. For example, when the camera module 1000 is a fixed-focus camera module, the lenses bearing portion 60 is selected as a lenses barrel. Correspondingly, when the camera module 1000 is a zoom camera module, the lenses bearing portion 60 is selected as a motor, such as but not limited to a voice coil motor.

Optionally, in an example of the camera module 1000, the lenses bearing portion 60 and the lenses holder 50 may be an integrated structure. In another example of the camera module 1000, the camera module 1000 may not be configured with the lenses bearing portion 60, in this case, the camera module 1000 keeps the optical lenses 40 in the photosensitive path of the photosensitive chip 13 by directly mounting the optical lenses 40 on the lenses holder 50.

FIGS. 14-19 show the packaging process of the camera module 1000.

Figure 14:
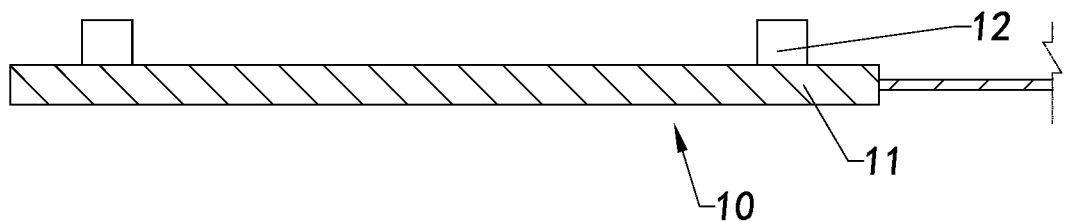
FIG. 14 is a schematic sectional view of the first manufacturing processes of a camera module according to the second preferred embodiment of the present invention.

Referring to FIG. 14, a set of the electronic components 12 are mounted on the circuit board 11. The type of the electronic component 12 is not limited in the camera module 1000 according to the present invention. For example, the electronic component 12 may be, but not limited to, a resistor, a capacitor, a controller, or the like.

Figure 15:
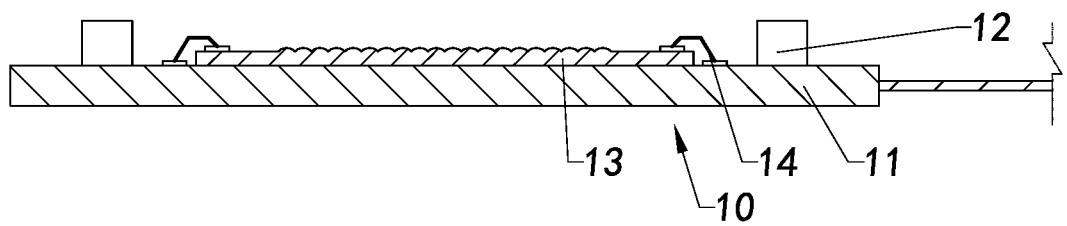
FIG. 15 is a schematic sectional view of the second manufacturing process of the camera module according to the above preferred embodiment of the present invention.

Referring to FIG. 15, the photosensitive chip 13 is mounted on the circuit board 11, and at least one set of guiding wires 14 with the two ends being conductively connected to the photosensitive chip 13 and the circuit board 11 respectively are formed by a wire bonding process, so as to form the circuit board assembly 10.

It is worth mentioning that, the stage shown in FIG. 15 may be prior to the stage shown in FIG. 14, i.e., firstly the photosensitive chip 13 is mounted on the circuit board 11, and then a set of the electronic components 12 are mounted on the circuit board 11 to form the circuit board assembly 10.

Figure 16:
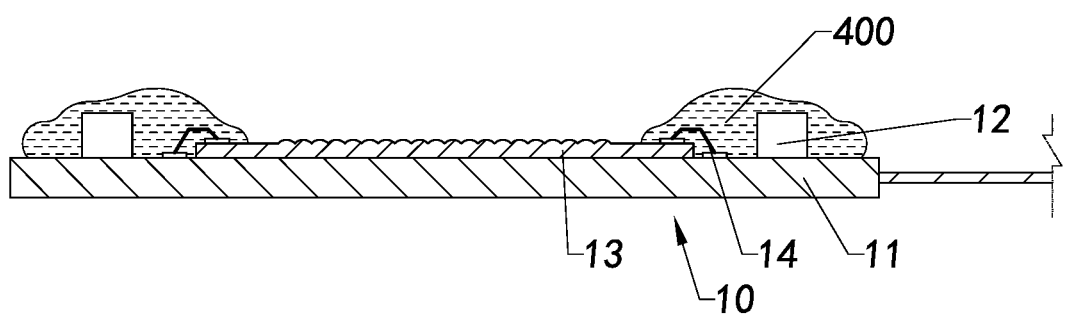
FIG. 16 is a schematic sectional view of the third manufacturing process of the camera module according to the above preferred embodiment of the present invention.

Referring to FIG. 16, a glue material 400 is applied to the circuit board assembly 10 so that the glue material 400 covers the electronic components 12. Preferably, the glue material 400 applied to the circuit board assembly 10 further extends inward to and wraps the non-photosensitive area 132 of the photosensitive chip 13, and extends outward to and wraps the circuit board 11; and the glue material 400 covers the guiding wires 14. More preferably, the glue material 400 applied to the circuit board assembly 10 has a ring shape, such as a square ring shape, which surrounds the photosensitive area 131 of the photosensitive chip 13. In this preferred example of the camera module 1000 shown in FIGS. 19-20, the glue material 400 applied to the circuit board assembly 10 covers the highest electronic component 12.

It is worth mentioning that the glue material 400 applied to the circuit board assembly 10 is the glue material 400 with a relatively high viscosity, so as to avoid an undesirable phenomenon, i.e. prevent the glue material 400 from flowing after being applied to the circuit board assembly 10, thereby avoiding contamination of the photosensitive area 131 of the photosensitive chip 13 during the process of packaging the camera module 1000.

Figure 17:
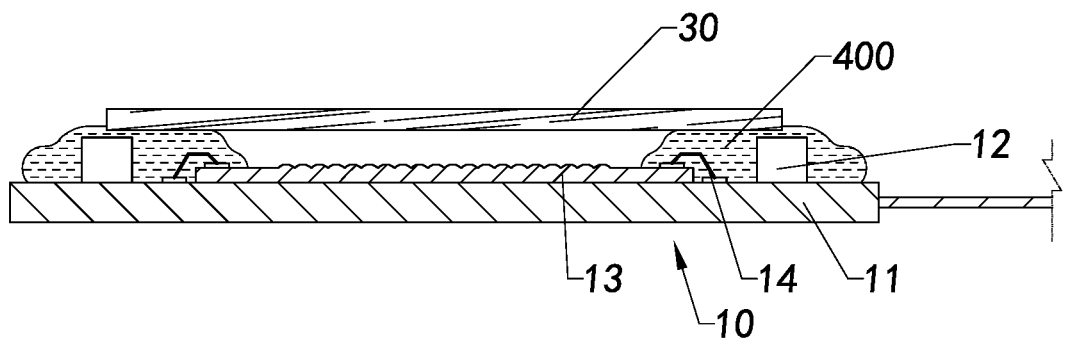
FIG. 17 is a schematic sectional view of the fourth manufacturing process of the camera module according to the above preferred embodiment of the present invention.

Referring to FIG. 17, the light filter 30 is mounted on the top of the glue material 400 applied to the circuit board assembly 10, so that the light filter 30 is kept in the photosensitive path of the photosensitive chip 13 by the glue material 400. When the light filter 30 is mounted on the top of the glue material 400 applied to the circuit board assembly 10, a force is applied to the light filter 30 in a direction where the photosensitive chip 13 is located, so that a flat surface is formed on the top of the glue material 400 applied to the circuit board assembly 10, and the light filter 30 and the photosensitive area 131 of the photosensitive chip 13 are kept flat. Since the glue material 400 applied to the circuit board assembly 10 is the glue material 400 with a relatively high viscosity, after the light filter 30 is mounted on the top of the glue material 400 applied to the circuit board assembly 10 and the external force applied to the light filter 30 is removed, the relative positions of the light filter 30 and the photosensitive chip 13 will not change.

Optionally, in other examples of the camera module 1000 of the present invention, the glue material 400 may be applied along a extending direction of the electronic components 12, for example, if the electronic components 12 of the camera module 1000 are in three rows; at this time, the glue material 400 is not applied into a state of surrounding the non-photosensitive area 131 of the photosensitive chip 13, i.e., the glue material 400 is also not applied on a side of the photosensitive chip 13 where the electronic components 12 are not arranged. After the photosensitive chip 30 is mounted on the top of the glue material 400, a gap will be formed between the light filter 30 and the circuit board assembly 10, and then the gap formed between the light filter 30 and the circuit board assembly 10 may be sealed by replenishing glue or the like.

Figure 18:
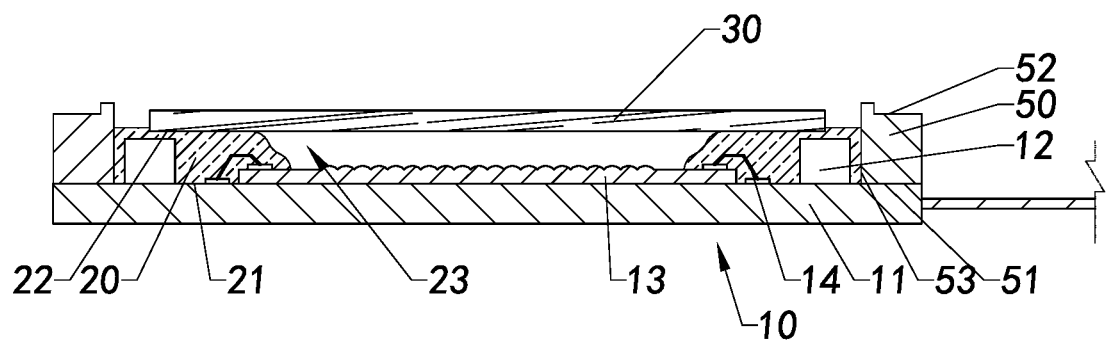
FIG. 18 is a schematic sectional view of the fifth manufacturing process of the camera module according to the above preferred embodiment of the present invention.

Referring to FIG. 18, the lenses holder 50 is mounted on the circuit board 11 of the circuit board assembly 10. In this preferred example of the camera module 1000 according to the present invention, the lower surface 51 of the lenses holder 50 is mounted on the circuit board 11 by the glue material 400, and the inner surface 53 of the lenses holder 50 is attached to the glue material 400.

After the lenses holder 50 is mounted on the circuit board 11, the glue material 400 applied to the circuit board assembly 10 is cured, so that the bonding portion 20 is formed by the glue material 400 applied to the circuit board assembly 10, and the light filter 30 is kept in the photosensitive path of on the photosensitive chip 13 by the bonding portion 20; wherein a side portion of the glue material 400 bonded to the circuit board assembly 10 forms the lower bonding side 21 of the bonding portion 20, and a side portion of the glue material 400 bonded to the light filter 30 forms the top bonding surface 22; wherein the lower surface 51 of the lenses holder 50 is attached to the circuit board 11 by the glue material 400, and the inner surface 53 of the lenses holder 50 is bonded to the bonding portion 20.

It is worth mentioning that in the camera module 1000 according to the present invention, the way of curing the glue material 400 applied to the circuit board assembly 10 is not limited and it is selected on the basis of the type of the glue material 400. For example, the glue material 400 applied to the circuit board assembly 10 may be cured by heating or ultraviolet light irradiation.

In the camera module 1000 according to the present invention, the top bonding surface 22 of the bonding portion 20 corresponds to the electronic components 12 arranged at the same height, so that a flatness of the top bonding surface 22 of the bonding portion 20 is ensured by the electronic components 12 arranged at the same height, thereby ensuring a flatness of the light filter 30 and the photosensitive area 131 of the photosensitive chip 13.

Referring to FIG. 19, the optical lenses 40 is mounted on the lenses bearing portion 60, and the lenses bearing portion 60 is mounted on the upper surface 52 of the lenses holder 50, so as to keep the optical lenses 40 in the photosensitive path of the photosensitive chip 13, thereby manufacturing the camera module 1000.

Figure 22:
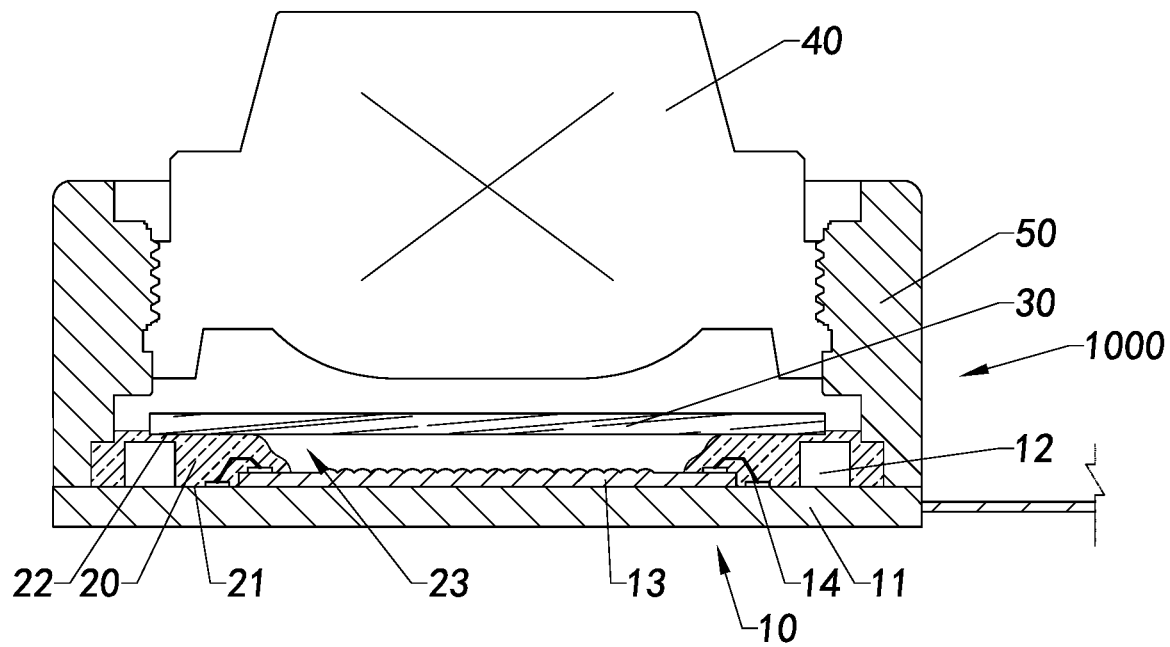
FIG. 22 is a schematic sectional view of a second modified implementation of the camera module according to the above preferred embodiment of the present invention.

FIG. 22 shows a modified implementation of the camera module 1000. The difference from the camera module 1000 shown in FIGS. 14-20 is that: in this specific example of the camera module 1000 shown in FIG. 22, the camera module 1000 is not provided with the lenses bearing portion 60, and the optical lenses 40 is directly mounted on the lenses holder 50, so that the optical lenses 40 is kept in the photosensitive path of the photosensitive chip 13 by the lenses holder 50.

In the packaging process of the camera module 1000 shown in FIG. 22, firstly the optical lenses 40 is mounted on the lenses holder 50, and then the lenses holder 50 is mounted on the circuit board 11 of the circuit board assembly 10, finally the glue material 400 applied to the circuit board assembly 10 is cured, so that the bonding portion 20 is formed by the glue material 400 applied to the circuit board assembly 10.

Figure 23:
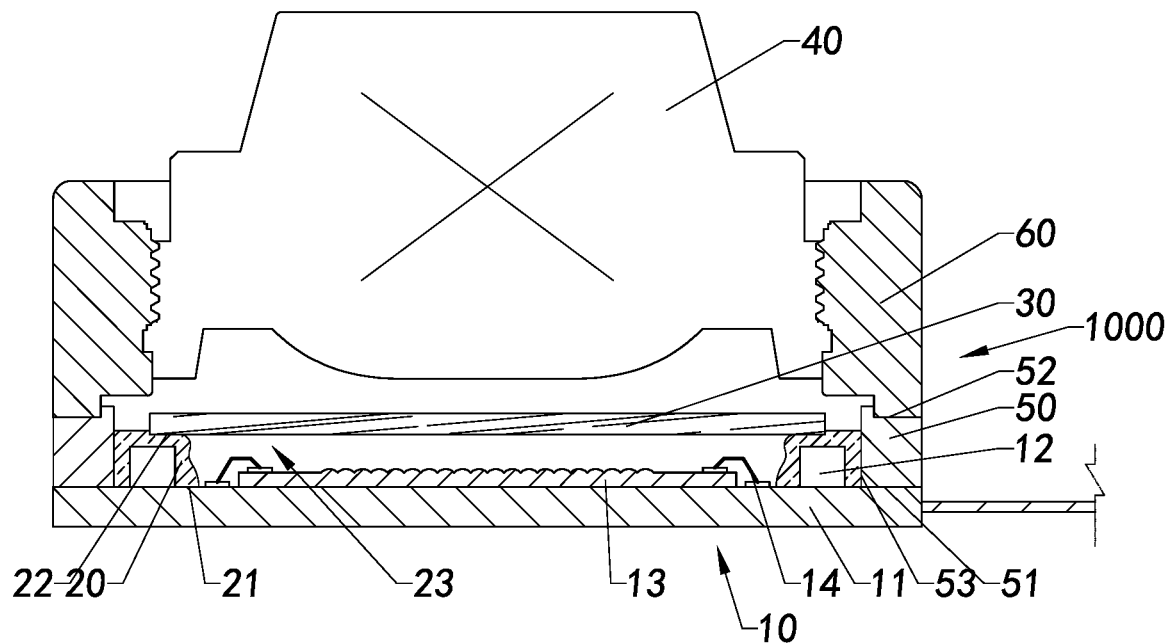
FIG. 23 is a schematic sectional view of a third modified implementation of the camera module according to the above preferred embodiment of the present invention.

FIG. 23 shows a modified implementation of the camera module 1000. The difference from the camera module 1000 shown in FIGS. 14-20 is that: in this specific example of the camera module 1000 shown in FIG. 23, the glue material 400 is only applied to the circuit board 11 of the circuit board assembly 10, so that after the glue material 400 is cured, the lower bonding side 21 of the bonding portion 20 is only bonded to the circuit board 11 of the circuit board assembly 10.

Figure 24:
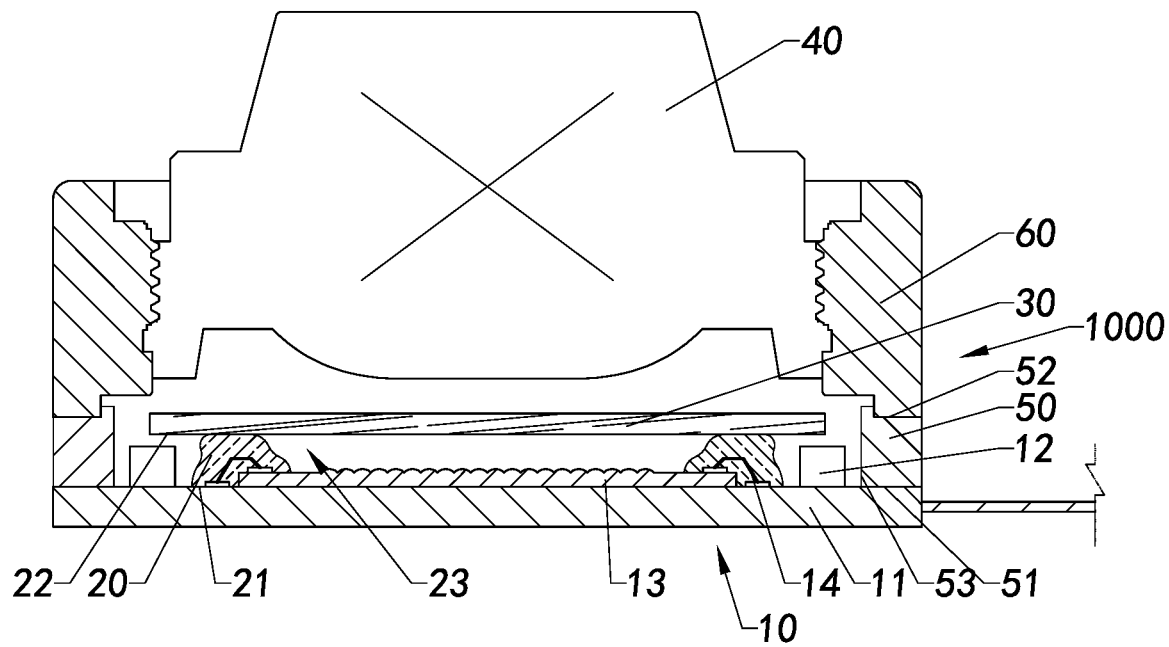
FIG. 24 is a schematic sectional view of a fourth modified implementation of the camera module according to the above preferred embodiment of the present invention.

FIG. 24 shows a modified implementation of the camera module 1000. The difference from the camera module 1000 shown in FIGS. 14-20 is that: in this specific example of the camera module 1000 shown in FIG. 24, the glue material 400 is only applied to the non-photosensitive area 132 of the photosensitive chip 13 of the circuit board assembly 10, so that after the glue material 400 is cured, the lower bonding side 21 of the portion 20 is only bonded to the non-photosensitive area 132 of the photosensitive chip 13 of the circuit board assembly 10. In this specific example of the camera module 1000 shown in FIG. 24, the top bonding surface 22 of the bonding portion 20 corresponds to the non-photosensitive area 132 of the photosensitive chip 13, so that the flatness of the top bonding surface 22 of the bonding portion 20 is ensured by the non-photosensitive area 132 of the photosensitive chip 13, thereby ensuring the flatness of the light filter 30 and the photosensitive area 131 of the photosensitive chip 13.

Figure 25:
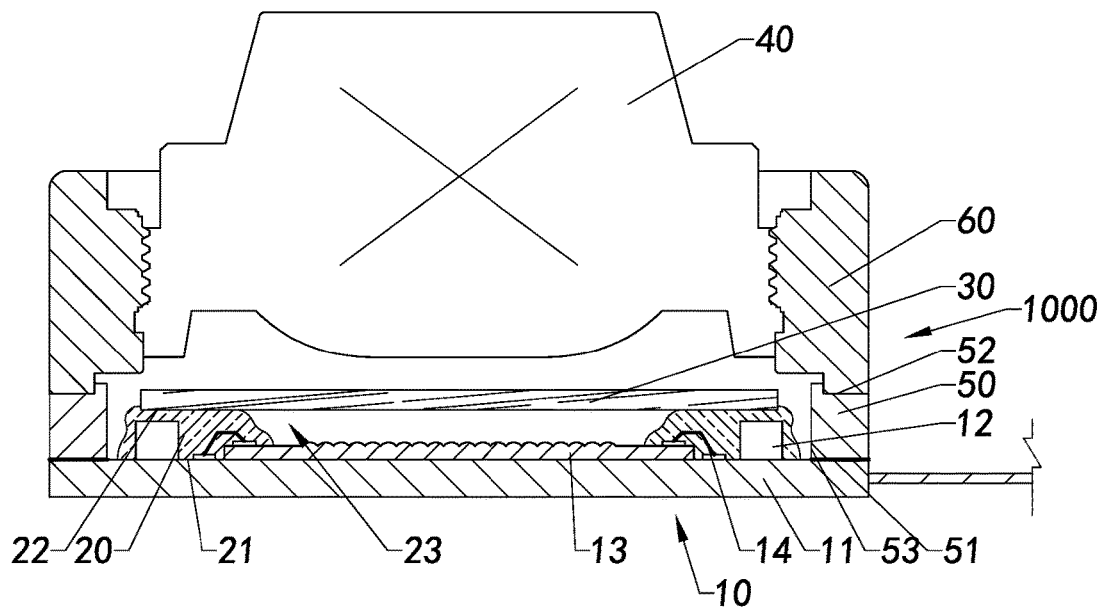
FIG. 25 is a schematic sectional view of a fourth modified implementation of the camera module according to the above preferred embodiment of the present invention.

FIG. 25 shows a modified implementation of the camera module 1000. The difference from the camera module 1000 shown in FIGS. 14-20 is that: in this specific example of the camera module 1000 shown in FIG. 25, the lower surface 51 of the lenses holder 50 is mounted on the circuit board 11, and the lenses bearing portion 60 is mounted on the upper surface 52 of the lenses holder 50, so that the optical lenses 40 is kept in the photosensitive path of the photosensitive chip 13 by the lenses holder 50 and the lenses bearing portion 60. In the packaging process of the camera module 1000 shown in FIG. 25, firstly the glue material 400 applied to the circuit board assembly 10 is cured, so as to form the bonding portion 20 by the glue material 400 applied to the circuit board assembly 10, and then the lower surface 51 of the lenses holder 50 is mounted on the circuit board 11, finally the lenses bearing portion 60 is mounted on the upper surface 52 of the lenses holder 50, so that the optical lenses 40 is kept in the photosensitive path of the photosensitive chip 13 by the lenses bearing portion 60.

Figure 26:
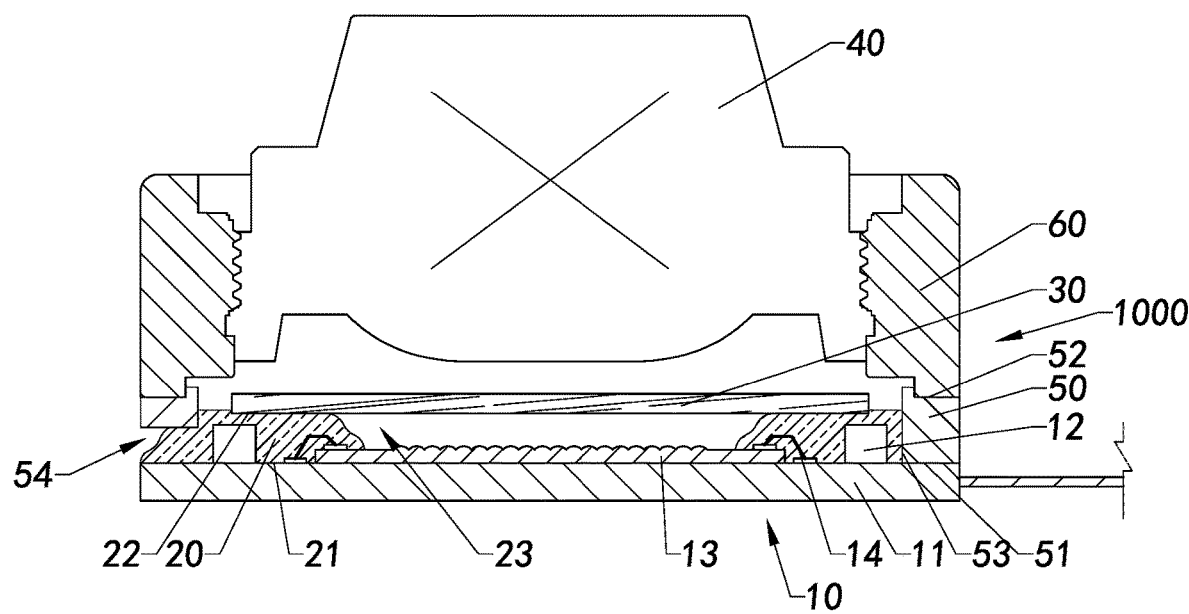
FIG. 26 is a schematic sectional view of a third modified implementation of the camera module according to the above preferred embodiment of the present invention.

FIG. 26 shows a modified implementation of the camera module 1000. The difference from the camera module 1000 shown in FIGS. 14-20 is that: the lenses holder 50 further has at least one notch 54 extending from the lower surface 51 to a direction of the upper surface 52, wherein after the lenses holder 54 is mounted on the circuit board 11, a part of the glue material 400 applied to the circuit board assembly 10 is accommodated in the notch 54 of the lenses holder 50. In this way, when the glue material 400 applied to the circuit board assembly 10 is cured, the gap 54 of the lenses holder 50 allows the glue material 400 to overflow from the inside of the lenses holder 50 to the outside, thereby preventing the glue material 400 from expanding inward and contaminating the photosensitive area 131 of the photosensitive chip 13 or blocking the photosensitive path of the photosensitive chip 13. After the glue material 400 applied to the circuit board assembly 10 is cured to form the bonding portion 20, a part of the bonding portion 20 is accommodated in the notch 54 of the lenses holder 50. That is to say, in this specific example of the camera module 1000 shown in FIG. 26, the notch 54 of the lenses holder 50 forms an opening for overflowing glue.

Figure 27:
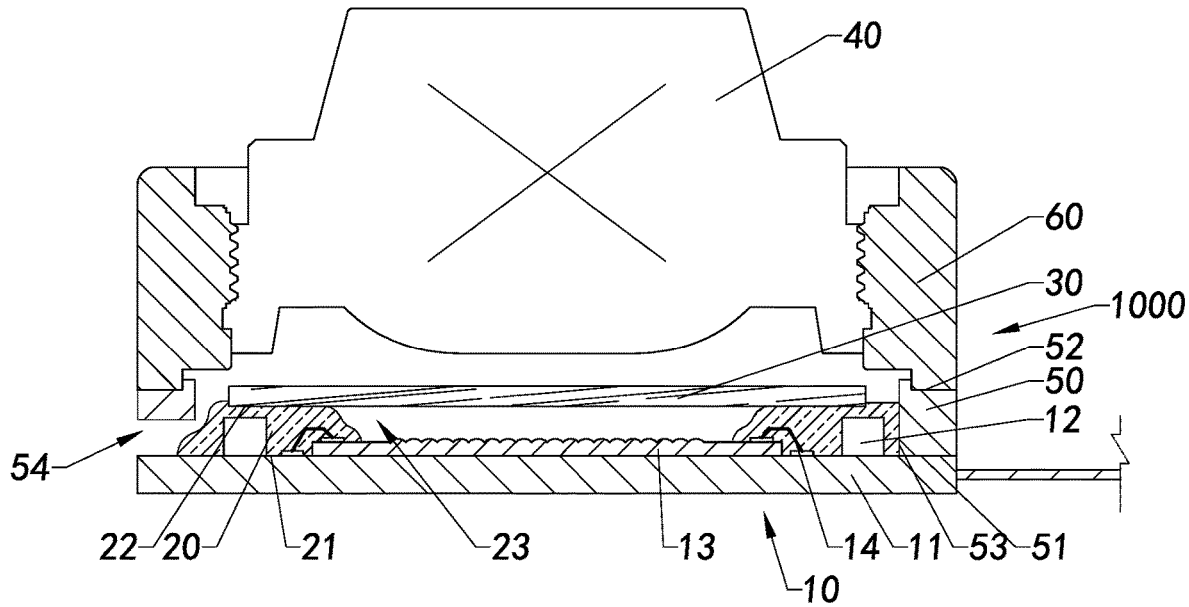
FIG. 27 is a schematic sectional view of a fourth modified implementation of the camera module according to the above preferred embodiment of the present invention.

FIG. 27 shows a modified implementation of the camera module 1000. The difference from the camera module 1000 shown in FIG. 26 is that: in this specific example of the camera module 1000 shown in FIG. 27, the inner surface 53 of the side portion of the lenses holder 50 provided with the notch 54 is not mounted on the glue material 400 applied to the circuit board assembly 10, and a gap is reserved between the inner surface 53 of the lenses holder 50 and the glue material 400 applied to the circuit board assembly 10. In this way, when the glue material 400 applied to the circuit board assembly 10 is cured, the gap 54 of the lenses holder 50 allows the air held between the lenses holder 50 and the glue material 400 applied to the circuit board assembly 10 to escape, so that the glue material 400 applied to the circuit board assembly 10 is allowed to expand in a direction of the circuit board assembly 10 of the lenses holder 50, thereby preventing the glue material 400 from expanding inward and contaminating the photosensitive area 131 of the photosensitive chip 13 or blocking the photosensitive path of the photosensitive chip 13. After the glue material 400 applied to the circuit board assembly 10 is cured to form the bonding portion 20, the gap 54 of the lenses holder 50 is sealed by the glue material 400 or other materials.

Figure 28:
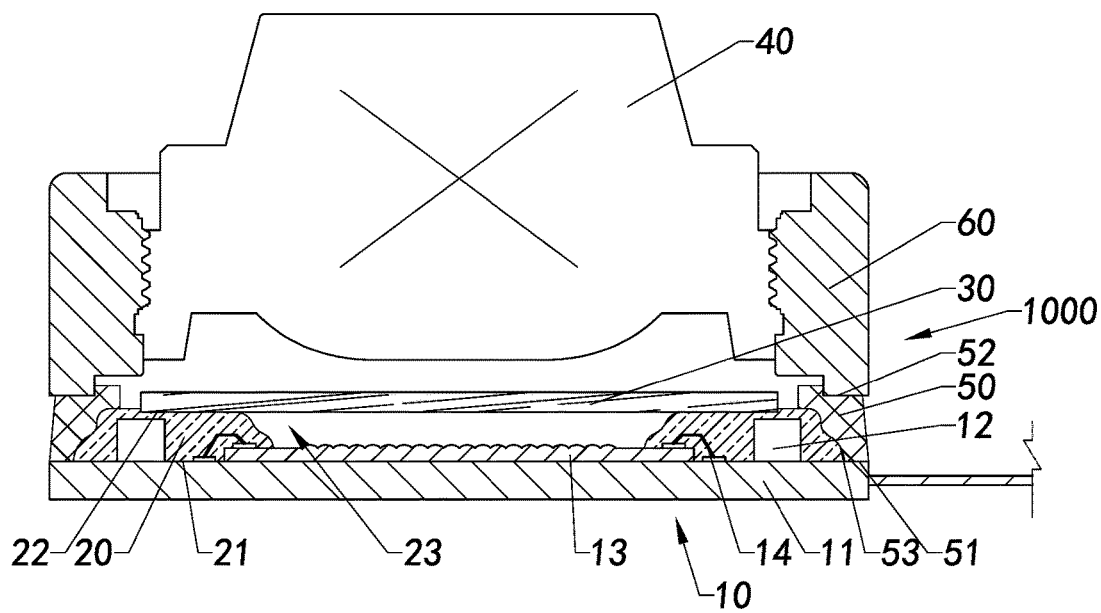
FIG. 28 is a schematic sectional view of a fourth modified implementation of the camera module according to the above preferred embodiment of the present invention.

FIG. 28 shows a modified implementation of the camera module 1000. The difference from the camera module 1000 shown in FIGS. 14-20 is that: in the camera module 1000 shown in FIG. 28, the lenses holder 50 is integrally formed on the circuit board 11 and the bonding portion 20. Particularly, after the glue material 400 applied to the circuit board assembly 10 is cured to form the bonding portion 20, the lenses holder 50 is formed by a molding process, so that the lower surface 51 of the lenses holder 50 is integrally bonded to the circuit board 11, and the inner surface 53 of the lenses holder 50 is integrally bonded to the bonding portion 20, thereby manufacturing the camera module 1000 shown in FIG. 28.

According to another aspect of the present invention, the present invention further provides a manufacturing method of a camera module 1000, wherein the manufacturing method includes the following steps:

(a) respectively bonding the lower bonding side 21 of the bonding portion 20 to the circuit board assembly 10 and bonding the light filter 30 to the top bonding surface 22 of the bonding portion 20, so as to keep the light filter 30 in the photosensitive path of the photosensitive chip 13 of the circuit board assembly 10; and (b) keeping the optical lenses 40 in the photosensitive path of the photosensitive chip 13 to manufacture the camera module 1000.

In a preferred example of the manufacturing method of the present invention, the step (a) further includes the following steps:

(a.1) applying glue material 400 to the circuit board assembly 10 around the photosensitive area 131 of the photosensitive chip 13;

(a.2) mounting the light filter 30 on the top of the glue material 400; and (a.3) curing the glue material 400 to form the bonding portion 20, wherein a side portion of the glue material 400 bonded to the circuit board assembly 10 forms the lower bonding side 21 of the bonding portion 20, and a side portion of the glue material 400 bonded to the light filter 30 forms the top bonding surface 22 of the bonding portion 20.

Preferably, in the step (a.1), the glue material 400 applied to the circuit board assembly 10 surrounds the photosensitive area 131 of the photosensitive chip 13, so that after the light filter 30 is mounted on the top of the glue material 400, a sealed space is formed between the light filter 30, the glue material 400 and the photosensitive chip 13, and the photosensitive area 131 of the photosensitive chip 13 is kept in the sealed space. In this way, during the process of packaging the camera module 1000, it is possible to prevent dust and other contaminants from falling into the photosensitive area 131 of the photosensitive chip 13 to cause undesirable phenomenon of stain defects. Optionally, in the step (a.1), the glue material 400 is only applied along an extending direction of the electronic components 12 of the circuit board assembly 10, and after the light filter 30 is mounted on the top of the glue material 400, a gap formed between the light filter 30 and the circuit board assembly 10 is sealed. For example, the gap formed between the light filter 30 and the circuit board assembly 10 may be sealed with the glue material 400 by replenishing glue.

In the step (a.2), a pressure is applied to the light filter 30 in a direction of the photosensitive chip 13, so that the light filter 30 is mounted on the top of the glue material 400. In this way, the light filter 30 forms a flat surface on the top of the glue material 400, and at this time, a flatness between the light filter 30 and the photosensitive area 131 of the photosensitive chip 13 may be ensured by the glue material 400, so that after the glue material 400 is cured to form the bonding portion 20, the flatness between the light filter 30 and the photosensitive area 131 of the photosensitive chip 13 may be ensured by the bonding portion 20.

In a preferred example of the manufacturing method of the present invention, before the step (a.3), the step (a) further includes the step of: mounting the lenses holder 50 on the circuit board 11 of the circuit board assembly 10, so that in the step (a.3), the lower surface 51 of the lenses holder 50 is bonded to the circuit board 11, and the inner surface 53 of the lenses holder 50 is bonded to the bonding portion 20. In this way, the packaging relationship between the lenses holder 50, the bonding portion 20, and the circuit board assembly 10 may be more reliable.

Preferably, the lenses holder 50 is provided with the notch 54, so that during the process of curing the glue material 400, the glue material 400 is allowed to overflow from the notch 54 of the lenses holder 50, thereby avoiding the undesirable phenomenon of contaminating the photosensitive area 131 of the photosensitive chip 13 or blocking the photosensitive path of the photosensitive chip 13 by the expansion of the glue material 400 in a direction of the photosensitive area 131 of the photosensitive chip 13. Optionally, when the lenses holder 50 is mounted on the circuit board 11 of the circuit board assembly 10, the inner surface 53 of the side portion of the lenses holder 50 provided with the notch 54 is not attached to the glue material 400, so that a gap is formed between the glue material 400 and the inner surface 53 of the lenses holder 50, and during the process of curing the glue material 400, the air held between the glue material 400 and the inner surface 53 of the lenses holder 50 is allowed to overflows from the notch 54 of the lenses holder 50, thereby guiding the glue material 400 to expand in a direction of the inner surface 53 of the lenses holder 50. In this way, it is possible to avoid the undesirable phenomenon of contaminating the photosensitive area 131 of the photosensitive chip 13 or blocking the photosensitive path of the photosensitive chip 13 by the expansion of the glue material 400 in a direction of the photosensitive area 131 of the photosensitive chip 13.

In a preferred example of the manufacturing method of the present invention, the step (a) further includes the following steps:

(a.1') forming the ring-shaped boss 200 on the peripheral edges of the light filter 30;

(a.2') mounting the ring-shaped boss 200 on the non-photosensitive area 132 of the photosensitive chip 13; and (a.3') curing the ring-shaped boss 200 to form the bonding portion 20, wherein a side portion of the ring-shaped boss 200 bonded to the non-photosensitive area 132 of the photosensitive chip 13 forms the lower bonding side 21 of the bonding portion 20, and a side portion of the ring-shaped boss 200 bonded to the light filter 30 forms the top bonding surface 22 of the bonding portion 20.

In another preferred example of the manufacturing method of the present invention, the step (a) further includes the following steps:

(a.1") forming the ring-shaped boss 200 on the non-photosensitive area 131 of the photosensitive chip 13;

(a.2") mounting the peripheral edges of the light filter 30 on the ring-shaped boss 200; and (a.3") curing the ring-shaped boss 200 to form the bonding portion 20, wherein a side portion of the ring-shaped boss 200 bonded to the non-photosensitive area 132 of the photosensitive chip 13 forms the lower bonding side 21 of the bonding portion 20, and a side portion of the ring-shaped boss 200 bonded to the light filter 30 forms the top bonding surface 22 of the bonding portion 20.

Those skilled in the art may understand that, the above embodiments are only examples, in which the features of different embodiments may be combined with each other to obtain implementations that are easily conceivable according to the disclosure of the present invention but are not clearly indicated in the accompanying drawings.

Those skilled in the art should understand that, the above description and the embodiments of the present invention shown in the drawings are only examples and do not limit the present invention. The purpose of the present invention has been completely and effectively achieved. The functions and structural principles of the present invention have been shown and explained in the embodiments. Without departing from the principles, the implementation of the present invention may have any deformation or modification.

The invention claimed is:

1. A photosensitive assembly comprising:
   a light filter;
   a circuit board assembly, the circuit board assembly including a circuit board and a photosensitive chip conductively connected to the circuit board; and
   a bonding portion, the bonding portion having a lower bonding side, a top bonding surface, and a light path, wherein the lower bonding side of the bonding portion is bonded to the circuit board assembly,
   wherein the bonding portion surrounds a photosensitive area of the photosensitive chip, so that the photosensitive area of the photosensitive chip is exposed to the light path of the bonding portion, wherein a periphery of the light filter is bonded to the top bonding surface of the bonding portion, so that the light filter is kept in a photosensitive path of the photosensitive chip by the bonding portion, and wherein the lower bonding side of the bonding portion is bonded to a non-photosensitive area of the photosensitive chip, and the top bonding surface of the bonding portion corresponds to the non-photosensitive area of the photosensitive chip.

2. The photosensitive assembly according to claim 1, wherein the lower bonding side of the bonding portion is further bonded to the circuit board.

3. The photosensitive assembly according to claim 1, wherein the circuit board assembly further includes a set of electronic components, at least three of the electronic components are arranged at equal heights on the circuit board and are conductively connected to the circuit board, the bonding portion embeds the electronic components, and the top bonding surface of the bonding portion corresponds to the electronic components.

4. The photosensitive assembly according to claim 3, wherein a plane on which the top bonding surface of the bonding portion is located is lower than a plane on which a top surface of a tallest one of the electronic components is located.

5. The photosensitive assembly according to claim 1, wherein a distance between a plane on which the top bonding surface of the bonding portion is located and a plane on which the photosensitive area of the photosensitive chip is located is greater than or equal to 0.15 mm.

6. The photosensitive assembly according to claim 1, wherein the bonding portion has four sides, adjacent sides are connected end to end and perpendicular to each other to form the light path between the four sides, and a width of at least one of the sides of the bonding portion is greater than or equal to 0.15 mm.

7. A camera module comprising:
optical lenses;
a light filter;
a circuit board assembly, the circuit board assembly including a circuit board and a photosensitive chip conductively connected to the circuit board; and
a bonding portion, the bonding portion having a lower bonding side, a top bonding surface, and a light path,
wherein the lower bonding side of the bonding portion is bonded to the circuit board assembly,
wherein the bonding portion surrounds a photosensitive area of the photosensitive chip, so that the photosensitive area of the photosensitive chip is exposed to the light path of the bonding portion,
wherein a periphery of the light filter is bonded to the top bonding surface of the bonding portion, so that the light filter is kept in a photosensitive path of the photosensitive chip by the bonding portion,
wherein the optical lenses are kept in the photosensitive path of the photosensitive chip, and
wherein the lower bonding side of the bonding portion is bonded to a non-photosensitive area of the photosensitive chip, and the top bonding surface of the bonding portion corresponds to the non-photosensitive area of the photosensitive chip.

8. The camera module according to claim 7, further comprising a lenses holder,
wherein the lenses holder has a lower surface, and the lower surface of the lenses holder is mounted on the circuit board.

9. The camera module according to claim 7, further comprising a lenses holder,
wherein the lenses holder has a lower surface, an upper surface corresponding to the lower surface, and an inner surface extending from the upper surface to the lower surface, and
wherein the lower surface of the lenses holder is mounted on the circuit board or bonded to the circuit board, and the inner surface of the lenses holder is bonded to the bonding portion.

10. The camera module according to claim 7, further comprising a lenses holder,
wherein the lenses holder has a lower surface, an upper surface corresponding to the lower surface, and an inner surface extending from the upper surface to the lower surface, and
wherein the lower surface of the lenses holder is bonded to the circuit board and the non-photosensitive area of the photosensitive chip, and the inner surface of the lenses holder is bonded to the bonding portion.

11. The camera module according to claim 9, further comprising four side portions,
wherein at least one of the side portions has a side surface, a bottom surface, and a connecting surface connected to the side surface and the bottom surface, and
wherein a distance from a connection position of the connecting surface and the side surface to a central axis of the camera module is greater than a distance from a connection position of the connecting surface and the bottom surface to the central axis of the camera module.

12. The camera module according to claim 11, wherein the connecting surface is an inclined plane, or the connecting surface is a convex arc surface, or the connecting surface is a step surface.

13. The camera module according to claim 12, wherein the connecting surface is formed on the lenses holder and the circuit board.

14. The camera module according to claim 9, wherein the lenses holder has at least one notch extending from the lower surface of the lenses holder to a direction of the upper surface, and a part of the bonding portion is accommodated in the notch of the lenses holder.

15. The camera module according to claim 10, further comprising a lenses bearing portion having a mounting surface, wherein the lenses bearing portion is mounted on the lenses holder by mounting the mounting surface of the lenses bearing portion to the upper surface of the lenses holder, and the optical lenses are arranged on the lenses bearing portion.

16. The camera module according to claim 15, wherein a range of a value of a distance parameter (D) between the mounting surface of the lenses bearing portion and a lower surface of the light filter is: $0.1 \text{ mm} \leq D \leq 0.2 \text{ mm}$.

17. The camera module according to claim 7, wherein a range of a value of a back focal length parameter (L) of the camera module is: $0.4 \text{ mm} \leq L \leq 0.6 \text{ mm}$, and the back focal length parameter (L) of the camera module refers to a distance between a lower surface of a lens of the optical lenses closest to the photosensitive chip and the photosensitive area of the photosensitive chip.

18. An electronic device comprising:
an electronic device body; and
at least one camera module according to claim 7, wherein the camera module is arranged in the electronic device body.

* * * * *